(12) United States Patent
Niki et al.

(10) Patent No.: US 10,593,833 B2
(45) Date of Patent: Mar. 17, 2020

(54) SEMICONDUCTOR LIGHT EMITTING DEVICE

(71) Applicant: Nichia Corporation, Anan-Shi (JP)

(72) Inventors: Isamu Niki, Anan (JP); Motokazu Yamada, Anan (JP); Masahiko Sano, Anan (JP); Shuji Shioji, Anan (JP)

(73) Assignee: Nichia Corporation, Anan-Shi (JP)

( * ) Notice: Subject to any disclaimer, the term of this patent is extended or adjusted under 35 U.S.C. 154(b) by 0 days.

(21) Appl. No.: 16/458,664

(22) Filed: Jul. 1, 2019

(65) Prior Publication Data

US 2019/0326472 A1 Oct. 24, 2019

Related U.S. Application Data

(60) Continuation of application No. 15/836,429, filed on Dec. 8, 2017, now Pat. No. 10,396,242, which is a
(Continued)

(30) Foreign Application Priority Data

| Jul. 24, 2001 | (JP) | 2001-223114 |
| Feb. 19, 2002 | (JP) | 2002-041737 |
| Jul. 23, 2002 | (JP) | 2002-213490 |

(51) Int. Cl.
*H01L 33/16* (2010.01)
*H01L 33/00* (2010.01)
(Continued)

(52) U.S. Cl.
CPC .......... *H01L 33/16* (2013.01); *H01L 21/0254* (2013.01); *H01L 21/02378* (2013.01);
(Continued)

(58) Field of Classification Search
CPC ....... H01L 33/007; H01L 33/20; H01L 33/22; H01L 33/26; H01L 21/02647;
(Continued)

(56) References Cited

U.S. PATENT DOCUMENTS

| 4,163,953 A | 8/1979 | Springthorpe et al. |
| 4,214,251 A | 7/1980 | Schairer |
| (Continued) | | |

FOREIGN PATENT DOCUMENTS

| EP | 0544512 | 6/1993 |
| EP | 0 966 047 | 12/1999 |
| (Continued) | | |

OTHER PUBLICATIONS

Communication of a Notice of Opposition dated Mar. 12, 2015, directed to ER Patent No. 2293352, 31 pages.
(Continued)

*Primary Examiner* — Ahmed N Sefer
(74) *Attorney, Agent, or Firm* — Morrison & Foerster LLP

(57) ABSTRACT

A semiconductor light emitting device including a substrate, an electrode and a light emitting region is provided. The substrate may have protruding portions formed in a repeating pattern on substantially an entire surface of the substrate while the rest of the surface may be substantially flat. The cross sections of the protruding portions taken along planes orthogonal to the surface of the substrate may be semi-circular in shape. The cross sections of the protruding portions may in alternative be convex in shape. A buffer layer and a GaN layer may be formed on the substrate.

18 Claims, 15 Drawing Sheets

Related U.S. Application Data continuation of application No. 15/175,281, filed on Jun. 7, 2016, now Pat. No. 9,865,773, which is a continuation of application No. 14/316,485, filed on Jun. 26, 2014, now Pat. No. 9,368,681, which is a continuation of application No. 13/730,354, filed on Dec. 28, 2012, now Pat. No. 8,796,721, which is a continuation of application No. 12/827,677, filed on Jun. 30, 2010, now Pat. No. 8,344,403, which is a continuation of application No. 10/897,163, filed on Jul. 23, 2004, now Pat. No. 7,804,101, which is a division of application No. 10/201,600, filed on Jul. 24, 2002, now Pat. No. 6,870,191.

(51) Int. Cl.
*H01L 33/20* (2010.01)
*H01L 33/22* (2010.01)
*H01L 21/02* (2006.01)
*H01L 33/26* (2010.01)
*H01L 33/32* (2010.01)
*H01L 33/24* (2010.01)

(52) U.S. Cl.
CPC ...... *H01L 21/02647* (2013.01); *H01L 33/007* (2013.01); *H01L 33/20* (2013.01); *H01L 33/22* (2013.01); *H01L 33/26* (2013.01); *H01L 33/32* (2013.01); *H01L 33/24* (2013.01); *H01L 2933/0083* (2013.01); *Y10T 428/24355* (2015.01); *Y10T 428/24479* (2015.01)

(58) Field of Classification Search
CPC .............. H01L 33/32; H01L 21/02378; H01L 21/0254; H01L 33/16; H01L 33/24
See application file for complete search history.

(56) References Cited

U.S. PATENT DOCUMENTS

| | | |
|---|---|---|
| 4,774,435 A | 9/1988 | Levinson |
| 4,881,237 A | 11/1989 | Donnelly |
| 5,003,357 A | 3/1991 | Kim |
| 5,061,974 A | 10/1991 | Onodera et al. |
| 5,309,001 A | 5/1994 | Watanabe et al. |
| 5,491,350 A | 2/1996 | Unno et al. |
| 5,696,389 A | 12/1997 | Ishikawa et al. |
| 5,734,225 A | 3/1998 | Biebuyck et al. |
| 5,779,924 A | 7/1998 | Krames et al. |
| 5,814,839 A | 9/1998 | Hosoba |
| 5,905,275 A | 5/1999 | Nunoue et al. |
| 5,955,748 A | 9/1999 | Nakamura et al. |
| 5,959,316 A | 9/1999 | Lowery |
| 6,072,819 A | 6/2000 | Shakuda |
| 6,091,083 A | 7/2000 | Hata et al. |
| 6,091,085 A | 7/2000 | Lester |
| 6,095,666 A | 8/2000 | Salam |
| 6,107,644 A | 8/2000 | Shakuda et al. |
| 6,133,589 A | 10/2000 | Krames et al. |
| 6,163,557 A | 12/2000 | Dunnrowicz et al. |
| 6,232,623 B1 | 5/2001 | Morita |
| 6,238,947 B1 | 5/2001 | Shakuda |
| 6,258,618 B1 | 7/2001 | Lester |
| 6,291,839 B1 | 9/2001 | Lester |
| 6,307,218 B1 | 10/2001 | Steigerwald et al. |
| 6,316,785 B1 | 11/2001 | Nunoue et al. |
| 6,325,850 B1 | 12/2001 | Beaumont et al. |
| 6,335,546 B1 | 1/2002 | Tsuda et al. |
| 6,346,771 B1 | 2/2002 | Salam |
| 6,348,096 B1 | 2/2002 | Sunakawa et al. |
| 6,410,942 B1 | 6/2002 | Thibeault et al. |
| 6,413,627 B1 | 7/2002 | Motoki et al. |
| 6,426,519 B1 | 7/2002 | Asai et al. |
| 6,445,007 B1 | 9/2002 | Wu et al. |
| 6,469,320 B2 | 10/2002 | Tanabe et al. |
| 6,479,889 B1 | 11/2002 | Yoshida et al. |
| 6,504,590 B1 | 1/2003 | Kikuchi et al. |
| 6,514,782 B1 | 2/2003 | Wierer, Jr. et al. |
| 6,555,845 B2 | 4/2003 | Sunakawa et al. |
| 6,566,231 B2 | 5/2003 | Ogawa et al. |
| 6,573,537 B1 | 6/2003 | Steigerwald et al. |
| 6,617,182 B2 | 9/2003 | Ishida et al. |
| 6,620,238 B2 | 9/2003 | Tsuda et al. |
| 6,635,901 B2 | 10/2003 | Sawaki et al. |
| 6,649,440 B1 | 11/2003 | Krames et al. |
| 6,791,119 B2 | 9/2004 | Slater, Jr. et al. |
| 6,802,902 B2 | 10/2004 | Beaumont et al. |
| 6,815,726 B2 | 11/2004 | Ishida et al. |
| 6,821,804 B2 | 11/2004 | Thibeault et al. |
| 6,821,805 B1 | 11/2004 | Nakamura et al. |
| 6,870,191 B2 | 3/2005 | Niki et al. |
| 6,940,098 B1 | 9/2005 | Tadatomo et al. |
| 6,994,751 B2 | 2/2006 | Hata et al. |
| 7,033,854 B2 | 4/2006 | Morita |
| 7,053,420 B2 | 5/2006 | Tadatomo et al. |
| 7,118,929 B2 | 10/2006 | Frayssinet et al. |
| 7,125,736 B2 | 10/2006 | Morita |
| 7,135,709 B1 | 11/2006 | Wirth et al. |
| 7,179,667 B2 | 2/2007 | Okagawa et al. |
| 2001/0003019 A1 | 6/2001 | Morita |
| 2001/0022495 A1 | 9/2001 | Salam |
| 2002/0000548 A1 | 1/2002 | Blalock et al. |
| 2002/0014681 A1* | 2/2002 | Tsuda .................... H01L 33/007 257/618 |
| 2002/0033521 A1 | 3/2002 | Matsuoka |
| 2002/0041148 A1 | 4/2002 | Cho et al. |
| 2002/0056846 A1 | 5/2002 | Tsuda et al. |
| 2002/0063521 A1 | 5/2002 | Salam |
| 2002/0102830 A1 | 8/2002 | Ishida |
| 2002/0117104 A1 | 8/2002 | Hata et al. |
| 2003/0025115 A1 | 2/2003 | Uemura et al. |
| 2003/0057444 A1 | 3/2003 | Niki et al. |
| 2003/0143771 A1 | 7/2003 | Kidoguchi et al. |
| 2003/0209705 A1 | 11/2003 | Emerson et al. |
| 2004/0048471 A1 | 3/2004 | Okagawa et al. |
| 2004/0119082 A1 | 6/2004 | Sugawara |
| 2004/0206299 A1 | 10/2004 | Tadatomo et al. |
| 2005/0001227 A1 | 1/2005 | Niki et al. |
| 2005/0035359 A1 | 2/2005 | Ishida et al. |
| 2005/0179130 A1 | 8/2005 | Tanaka et al. |
| 2005/0263778 A1 | 12/2005 | Hata et al. |
| 2007/0026643 A1 | 2/2007 | Tadatomo et al. |
| 2007/0026644 A1 | 2/2007 | Tadatomo et al. |
| 2007/0072320 A1 | 3/2007 | Frayssinet et al. |
| 2008/0303043 A1 | 12/2008 | Niki et al. |
| 2009/0042328 A1 | 2/2009 | Niki et al. |
| 2018/0158988 A1 | 6/2018 | Niki et al. |

FOREIGN PATENT DOCUMENTS

| | | |
|---|---|---|
| EP | 1088914 A1 | 4/2001 |
| EP | 1101841 | 5/2001 |
| EP | 1328014 | 7/2003 |
| EP | 1 378 949 | 1/2004 |
| GB | 2296378 | 6/1996 |
| GB | 2304230 | 3/1997 |
| GB | 2 329 238 | 3/1999 |
| GB | 2331625 | 5/1999 |
| GB | 2 341 488 | 3/2000 |
| GB | 2381380 | 4/2003 |
| GB | 2381381 | 4/2003 |
| JP | 56-87383 | 7/1981 |
| JP | 58-96781 | 6/1983 |
| JP | 62-76686 | 4/1987 |
| JP | 4-59967 | 5/1992 |
| JP | 4-313281 | 11/1992 |
| JP | 5-85894 | 4/1993 |
| JP | 5-90634 | 4/1993 |
| JP | 5-145119 A | 6/1993 |
| JP | 5-183193 | 7/1993 |
| JP | 5-59861 U | 8/1993 |
| JP | 5-335622 | 12/1993 |
| JP | 6-237012 A | 8/1994 |

(56) References Cited

FOREIGN PATENT DOCUMENTS

| | | |
|---|---|---|
| JP | 6-291368 | 10/1994 |
| JP | 6-334213 | 12/1994 |
| JP | 8-222763 | 8/1996 |
| JP | 8-236870 | 9/1996 |
| JP | 9-312442 | 12/1997 |
| JP | 10-4209 | 1/1998 |
| JP | 10-48403 | 2/1998 |
| JP | 10-209495 A | 8/1998 |
| JP | 10-270801 | 10/1998 |
| JP | 11-40849 | 2/1999 |
| JP | 11-150306 | 6/1999 |
| JP | 11-195813 | 7/1999 |
| JP | 11-224960 | 8/1999 |
| JP | 11-238687 | 8/1999 |
| JP | 11-274560 A | 10/1999 |
| JP | 11-274568 | 10/1999 |
| JP | 2000-21772 | 1/2000 |
| JP | 2000-106455 | 4/2000 |
| JP | 2000-124500 | 4/2000 |
| JP | 2000-156524 | 6/2000 |
| JP | 2000-164930 | 6/2000 |
| JP | 2000-174339 | 6/2000 |
| JP | 2000-216431 | 8/2000 |
| JP | 2000-216497 | 8/2000 |
| JP | 2000-216502 A | 8/2000 |
| JP | 2000-282047 | 9/2000 |
| JP | 2000-277437 | 10/2000 |
| JP | 2000-331947 | 11/2000 |
| JP | 2000-332300 | 11/2000 |
| JP | 2001-7393 | 1/2001 |
| JP | 2001-24222 | 1/2001 |
| JP | 2001-068067 | 3/2001 |
| JP | 2001-94216 | 4/2001 |
| JP | 2001-148348 | 5/2001 |
| JP | 2001-160539 | 6/2001 |
| JP | 2001-176809 | 6/2001 |
| JP | 2001-223114 | 7/2001 |
| JP | 2001-250985 | 9/2001 |
| JP | 2001-267692 | 9/2001 |
| JP | 2002-041737 | 2/2002 |
| JP | 2002-164296 | 6/2002 |
| JP | 2002-164571 | 6/2002 |
| JP | 2002-213490 | 7/2002 |
| JP | 2002-280611 | 9/2002 |
| JP | 2003-197961 | 7/2003 |
| JP | 2005-101566 | 4/2005 |
| WO | WO-99/20816 A1 | 4/1999 |
| WO | WO-01/24280 | 4/2001 |
| WO | WO-01/41225 | 6/2001 |
| WO | WO-01/47039 | 6/2001 |
| WO | WO-2002/23604 | 3/2002 |
| WO | WO-02/103813 | 12/2002 |
| WO | WO-03/010831 | 2/2003 |

OTHER PUBLICATIONS

Guan, J. J. et al. (2001). "Chemical Processing and Materials Compatibility of High-K Dielectric Materials for Advanced Gate Stacks," *Solid State Phenomena* 76-77:19-22.

Okagawa, H. et al.(2001). "Development of High-Power Ultraviolet Light-Emitting Diodes Using Lateral Epitaxy on Patterned Substrate," *Mitsubishi Densen Kogyo Jiho*(98):92-96.

Ponce, F.A. et al.(1996). "Spatial Distribution of the luminescene in GaN thin films," *Appl. Phys. Lett.* 68(1).:57-59.

Tadatomo et al. (2001). "High Output Power InGaN UV Light-emitting Diodes," Japanese Journal of *Applied Physics* 40:583-585.

Yamada, Motokazu et al. (2002). "InGaN-Based Near-Ultraviolet and Blue-Light-Emitting Diodes with High External Quantum Efficiency Using a Patterned Sapphire Substrate and a Mesh Electrode," *Japan Journal Applied Physics* (41):L1431-1433.

Yu et al.(1997). "Optical Properties of Wurtzite Structure GaN on Sapphire Around Fundamental Absorption Edge (.78-4.77 eV) by Spectroscopic Elliposmetry and the Optical Transmission Method," *Appl. Phys. Ltt.*70(24):3209-3211.

European Search Report dated Oct. 28, 2010, directed to European Application No. 10 17 1097; 7 pages.

European Search Report dated Feb. 8, 2011, directed to European Patent Application No. 10190784.8; 7 pages.

European Search Report dated Feb. 18, 2011, directed to European Patent Application No. 10189616.5; 7 pages.

EP Search Report dated Oct. 24, 2011, directed to EP Application No. 04771806.9; 4 pages.

Japanese Office Action dated Dec. 5, 2006, directed to counterpart JP application No. 2002-213490.

Japanese Notice of Dismissal of Amendment dated Jul. 17, 2007, directed to JP Application No. 2002-213490.

Provision of Relevant Information on Prior Arts dated Oct. 29, 2007, directed to JP Publication No. 2006-332714.

Partial Translation of Japanese Decision for Dismissal of Amendment dated Jul. 1, 2008, directed at counterpart JP application No. 2006-252509; 4 pages.

Japanese Office Action dated Apr. 28, 2009, directed at application No. 2006-252509; 15 pages.

Japanese Office Action dated May 15, 2012, directed to Japanese Application No. 2009-103189; 4 pages.

Korean Office Action dated May 28, 2010, directed at application No. 10-2007-7017029; 5 pages.

Korean Office Action dated Mar. 8, 2011, directed to Korean Application No. 10-2006-7003347; 4 pages.

Notification of transmitting a request for invalidation dated Oct. 31, 2011, directed to Japanese Patent No. 4055503; 45 pages.

Niki et al., U.S. Office Action dated Jul. 10, 2003, directed towards related U.S. Appl. No. 10/201,600; 7 pages.

Niki et al., U.S. Office Action dated Jan. 12, 2006, directed towards related U.S. Appl. No. 10/897,163; 10 pages.

Niki et al., U.S. Office Action dated Oct. 11, 2006, directed towards related U.S. Appl. No. 10/897,163; 9 pages.

Niki et al., U.S. Office Action dated Apr. 6, 2007, directed towards related U.S. Appl. No. 10/897,163; 11 pages.

Niki et al., U.S. Office Action dated Oct. 22, 2007, directed towards related U.S. Appl. No. 10/897,163; 9 pages.

Niki et al., U.S. Office Action dated Apr. 4, 2008, directed towards related U.S. Appl. No. 10/897,163; 13 pages.

Niki et al., U.S. Office Action dated Oct. 23, 2008, directed towards related U.S. Appl. No. 10/897,163; 16 pages.

Niki et al., U.S. Office Action dated Sep. 2, 2009, directed towards U.S. Appl. No. 10/897,163; 10 pages.

Niki et al., U.S. Office Action dated May 12, 2009, directed towards related U.S. Appl. No. 12/022,794; 12 pages.

Niki et al., U.S. Office Action dated Jan. 20, 2012, directed to U.S. Appl. No. 12/827,486; 15 pages.

Niki et al., Office Action dated Mar. 8, 2012, directed to U.S. Appl. No. 12/827,646; 15 pages.

Niki et al., Office Action dated Mar. 13, 2012, directed to U.S. Appl. No. 12/827,677; 10 pages.

Niki et al., Office Action dated Aug. 6, 2013, directed to U.S. Appl. No. 13/730,354; 9 pages.

Niki et al., U.S. Office Action dated Oct. 9, 2014, directed to U.S. Appl. No. 14/316,485; 18 pages.

Niki et al., U.S. Office Action dated Jun. 11, 2015, directed to U.S. Appl. No. 14/316,485; 9 pages.

Tanaka et al., U.S. Office Action dated Oct. 17, 2008, directed towards related U.S. Appl. No. 10/920,419; 14 pages.

Tanaka et al., U.S. Office Action dated Jan. 8, 2008, directed towards related U.S. Appl. No. 10/920,419; 13 pages.

Tanaka et al., U.S. Office Action dated Apr. 26, 2007, directed towards related U.S. Appl. No. 10/920,419; 11 pages.

Tanaka et al., U.S. Office Action dated Aug. 2, 2006, directed towards related U.S. Appl. No. 10/920,419;15 pages.

Tanaka et al., U.S. Office Action dated May 4, 2009, directed at U.S. Appl. No. 10/920,419; 9 pages.

Tanaka et al., U.S. Office Action dated Jun. 2, 2011, directed towards U.S. Appl. No. 12/716,506; 8 pages.

Tanaka et al., U.S. Office Action dated Sep. 17, 2010, directed to U.S. Appl. No. 12/716,506; 7 pages.

(56) References Cited

OTHER PUBLICATIONS

Hiramatsu, K. et al., "Fabrication and characterization of low defect density GaN using facet-controlled epitaxial lateral overgrowth (FACELO)", Journal of Crystal Growth, Elsevier, Amsterdam, NL, vol. 221, No. 1-4, Dec. 1, 2000, pp. 316-326.
Extended European Search Report dated Jun. 14, 2017, directed to European Application No. 17158639.9; 11 pages.
Niki et al., U.S. Office Action dated Nov. 16, 2016, directed to U.S. Appl. No. 15/175,281; 9 pages.
Niki et al. U.S. Office Action dated May 5, 2017, directed to U.S. Appl. No. 15/175,281; 7 pages.
Chen, Y. et al. (Jan. 1, 2012). "The Formation and the Plane Indices of Etched Facets of Wet Etching Patterned Sapphire Substrate," Journal of the Electrochemical Society 159(6):D362-D366.
European Office Action dated Mar. 23, 2018, directed to European Patent Application No. 17 158 639.9; 8 pages.
Niki et al., U.S. Office Action dated Jun. 14, 2018 directed to U.S. Appl. No. 15/836,429; 21 pages.

* cited by examiner

SEMICONDUCTOR LIGHT EMITTING DEVICE

RELATED APPLICATIONS

This application is a continuation of U.S. application Ser. No. 15/836,429 filed Dec. 8, 2017, which is a continuation of U.S. application Ser. No. 15/175,281, filed Jun. 7, 2016, now U.S. Pat. No. 9,865,773, which is a continuation of U.S. application Ser. No. 14/316,485, filed Jun. 26, 2014, now U.S. Pat. No. 9,368,681, which is a continuation of U.S. application Ser. No. 13/730,354, filed Dec. 28, 2012, now U.S. Pat. No. 8,796,721, which is a continuation of U.S. application Ser. No. 12/827,677, filed Jun. 30, 2010, now U.S. Pat. No. 8,344,403, which is a continuation of U.S. application Ser. No. 10/897,163, filed Jul. 23, 2004, now U.S. Pat. No. 7,804,101, which is a divisional of U.S. application Ser. No. 10/201,600, filed Jul. 24, 2002, now U.S. Pat. No. 6,870,191, which claims priority from Japanese Patent Application Nos. 2001-223114, filed Jul. 24, 2001, 2002-041737 filed Feb. 19, 2002, and 2002-213490 filed Jul. 23, 2002, the entire contents of which applications are incorporated herein by reference.

FIELD OF THE INVENTION

The present invention relates to a semiconductor light emitting device, in particular, to a nitride-based compound semiconductor light emitting device wherein a recess or a protruding portion is provided in a substrate so that defects do not occur in the semiconductor and. thereby, the direction of guided light is changed in a semiconductor layer to increase the external quantum efficiency.

DESCRIPTION OF THE PRIOR ART

In a semiconductor light emitting device, for example, in a light emitting diode (LED), an n-type semiconductor layer, a light emitting region and a p-type semiconductor layer are essentially made to grow on top of a substrate to form a layered structure while a structure is adopted wherein electrodes are formed on the p-type semiconductor layer and on the n-type semiconductor layer Light, generated through recombination of holes and electrons that have been injected through the semiconductor layers to the light emitting region, is emitted through a light transmitting electrode on the p-type semiconductor layer or from the substrate. Here, the light transmitting electrode means an electrode that allows light to be transmitted through the electrode and that is made of a metal thin film or of a transparent conductive film formed on almost the entirety of the p-type semiconductor layer.

In order to control the layered structure of a light emitting diode at atomic level, the substrate is processed so that the flatness thereof becomes of a level of a mirror surface. Semiconductor layers, a light emitting region and electrodes on top of a substrate form a layered structure wherein the layers are parallel to each other. Since the index of refraction of the semiconductor layers is high, a light guide is formed between the surface of the p-type semiconductor layer and the surface of the substrate. That is to say, the light wave guide is made in a structure wherein the semiconductor layers having a high index of refraction are sandwiched between the substrate and the light transmitting electrode having a low index of refraction.

Accordingly, in the case that light enters the inner-surface of the electrode or the outer-surface of the substrate at an angle larger than a critical angle, the light is layers trapped within the light guide. The light is reflected at the interface between the electrode and the p-type semiconductor layer and at the surface of the substrate to propagate laterally in the layered structure of the semiconductor. Since the light loses its energy during the propagation in the semiconductor layer, the external quantum efficiency of the device is lowered. That is to say, the light that has entered the interface at an angle larger than the critical angle repeat reflection in the light guide and finally be absorbed. Therefore, the emitted light is attenuated and cannot be effectively emitted to the outside, which lowers the external quantum efficiency of the device.

A method has been proposed wherein a light emitting diode chip is processed to be of a hemispherical form or of a truncated pyramidal form so that light generated in the light emitting region is made to enter the surface at an angle smaller than the critical angle. However, it is difficult to make such a chip.

Also, a method has also been proposed wherein the top surface or the side of a light emitting diode is roughened. However, with such a method, there is a risk that the p-n junction may be partially damaged and the effective light emitting region is reduced.

Another method has been proposed wherein light generated in the light emitting region is scattered by creating a recess or protrusion in the surface of a substrate so that the external quantum efficiency is increased (see Japanese laid-open patent No. 11-274568 (1999)). According to this method, in a GaN-based LED wherein the sapphire substrate, n-type GaN, p-type GaN and a transparent electrode are sequentially layered, the surface of the sapphire substrate is randomly roughed by means of a mechanical polishing or etching. Thereby, light that has entered the sapphire substrate is scattered so that the external quantum efficiency is increased.

SUMMARY OF THE INVENTION

However, in the above-described conventional light emitting diode, the external quantum efficiency may be lowered by the recess or the protrusion. That is to say, in the case that the surface is roughened at random to generate recess or protrusion, the crystallinity of the grown GaN may be lowered. Therefore, the luminous efficiency, i.e. internal quantum efficiency, in the GaN semiconductor layers is lowered, and thus the external quantum efficiency is lowered rather than raised. In addition, if the light absorption within the light guide is so large, the external quantum efficiency does not reach a sufficient level only with the randomly roughed surface.

Therefore, an object of the present invention is to provide a semiconductor light emitting device wherein an improved external quantum efficiency can be stably secured.

According to the present invention, a semiconductor light emitting device has a light emitting layer and two semiconductor layers which are formed on the surface of the substrate made of different material from that of the semiconductor layers. The light emitting region emits light to outside through the semiconductor layer or substrate. The LED is characterized in that at least one recess and/or protrusion is formed on the surface of the substrate so that the light generated in the light-emitting region is scattered or diffracted, and that the recess and/or protrusion prevents crystal defects from occurring in the semiconductor layers. Here, "prevent crystal defect from occurring" means that the recess or protrusion causes neither an morphological problem, such as "pits", nor increase of dislocations in the semiconductor layers.

One of the characteristics of the present invention is in that the recesses and/or protrusions, having such shapes as to prevent defects from growing iii a semiconductor layer on the substrate, are formed on the surface of the substrate. The recesses and/or protrusions are formed not at the interface between the semiconductor layer and the electrode, but at the interface between the semiconductor layer and the substrate. This improves the crystallinity of the light emitting region (active layer) and increase the output power of the device. In particular, in the case of a gallium nitride-based component semiconductor light emitting device, a substrate, an n-side nitride semiconductor layer, a light emitting region (active layer) and a p-side nitride semiconductor layer are layered, in this order, wherein the film thickness of the p-side nitride semiconductor layer is less than that of the n-side nitride semiconductor layer. Therefore, recesses or protruding portions are provided at the interface between the semiconductor layer and the substrate rather than at the interface between the semiconductor layer and the electrode and thereby, the effect due to unevenness is mitigated by the thick n-side nitride semiconductor layer so that the crystallinity of the light emitting region (active layer) can be maintained in an good condition.

In the case of a semiconductor light emitting device having a conventional flat substrate, light propagated through the semiconductor layer in the lateral direction attenuates before emerging from the semiconductor layer because a portion thereof is absorbed by the semiconductor layer or by the electrode during propagation. On the contrary, according to the present invention, light propagated in the lateral direction in the ease of a conventional flat substrate is scattered or diffracted by recesses and/or protruding portions and finally efficiency emitted from the upper semiconductor layer or the lower substrate. As a result, the external quantum efficiency can be greatly increased. That is to say, first, light flux directed upward or downward from the substrate increases through the scattering and diffracting effects of light due to the unevenness so that the frontal brightness, which is the brightness of the light observed from the front of the light emitting surface of the device, can be enhanced. Second, light propagated in the lateral direction is reduced through the scattering and diffracting effects of the unevenness so that the total amount of light emission can be enhanced by reducing the absorption loss during propagation.

In addition, crystal defects do not increase in the semiconductor layer even in the case that recesses and/or protruding portions are created in the surface portion of the substrate. Therefore, the above-described high external quantum efficiency can be stably secured. In the present invention, it is preferable for the inside of the recesses or the surroundings of the protruding portions to be completely filled in with a semiconductor layer. This is because, in the case that a cavity exists inside a recess or in the surroundings of a protruding portion, the scattering or diffracting effects are prevented. This lowers the efficiency of the light emission.

Either recesses or protruding portions may be created in the surface portion of the substrate. Combination of recesses and protruding portions may be created. Such combination may provide similar working effects. However, protrusions are more preferable than recesses, because it is easier to completely fill the surrounding of protrusions rather than recesses. If a cavity is remained around the protrusions or recesses, the scattering or diffracting effects are prevented, which lowers the output power of the device.

Shapes of recesses and/or protruding portions for preventing the growth of defects in the semiconductor layer are, concretely, shapes having, as component sides, lines that cross a plane approximately parallel to the stably growing face of the semiconductor In other words, if the shapes are observed from the upper side of the substrate, the shapes have lines which are unparallel to the stably growing face of the semiconductor. Here, the stably growing face indicates the surface on which the growth rate of the material made to grow is slower than any other surface. Generally, the stably growing surface is observed as a facet during the crystal is grown. For example, in the case of gallium nitride semiconductors, the stable growing faces are the ones parallel to the A axis (especially, M face). Therefore, the recesses or protruding portions are formed, when observed from the upper side, in polygon of which component lines are unparallel to the A axis-parallel plane. In other words, in polygon of which component lines are unparallel to A axis. In the case that the recesses and/or protruding portions have, as component sides, lines approximately parallel to the stably growing face of the semiconductor, crystal defects occur in such portions at the time of the film growth of the semiconductor layer and these defects lower the internal quantum efficiency which causes the lowering of the external quantum efficiency.

More concretely, the recesses and/or protruding portions can be, for example, polygons, triangles, parallelograms or hexagons, and are preferably equilateral triangles, rhomboids or regular hexagons having a vertex in a plane approximately parallel to the stably growing face of the semiconductor and having, as component sides, lines that cross the plane approximately parallel to the stably growing face of the semiconductor.

Here, in the present specification, the phrase "a recess or a protruding portion is in the form of a polygon" means that the shape of the recess or of the protruding portion in the plan view observed from above is in the form of a polygon. It is not necessary to form a complete polygon. The edge of the polygons may be rounded as a result of processing.

For example, in the case that a GaN-based semiconductor is made to grow on a C plane of a sapphire substrate, the growth starts in hexagonal islands having planes parallel to A axis, which planes are the stably growing face of a GaN-based semiconductor, as a component side, and then, these islands are connected to become a uniform semiconductor layer. Therefore, a regular hexagon having an A axis as a component side, is assumed and a recess or a protruding portion is created in a polygon (for example, a triangle, a hexagon, or the like) having, as a component side, a line perpendicular to a segment that connects the center of the above hexagon and the vertex. A GaN-based semiconductor that is flat and has an excellent crystallinity can be made to grow on tap of a sapphire substrate wherein unevenness is created in the above manner.

In addition, though one recess and/or protruding portion may be sufficient for the invention, when a pattern is formed by repeating the shape of a recess or of a protruding portion, the efficiency of scattering or diffraction of light increases so that the external quantum efficiency can be further increased. Here, in the present invention, even in the case that recesses and/or protruding portions are provided on a substrate in a repeating pattern, the semiconductor layer is made to grow so that local crystal defects due to recesses or to protruding portions can be prevented and thereby, the entire surface of the substrate can be used as a light emitting surface.

The present invention is characterized in that recesses and/or protruding portions are created in the surface portion of a substrate to scatter or diffract light. The material itself for the substrate and for the semiconductor of the light emitting device is not directly related to the invention and any material, for example, III-V group elements-based semiconductors, concretely, a GaN-based semiconductor, can be utilized for a semiconductor layer of a semiconductor light emitting device. The stably growing face of a GaN-based semiconductor layer is an M plane {1-100} of a hexagonal crystal. Here, {1-100} represents all of (1-100), (01-10) and (−1010). An M face is one of the faces parallel to A axis. In some growing conditions, the stably growing faces of GaN-based semiconductors are the faces parallel to A axis other than M faces.

As for the substrate, a sapphire substrate, an SiC substrate or a spinel substrate can be used. For example, a sapphire substrate having a C plane (0001) as a main surface can be used as the above-described substrate. In this case, an M plane, which is the stably growing face of a GaN-based semiconductor layer, is a plane parallel to an A plane {11-20 of a sapphire substrate. Here, {11-20} represents all of (11-20), (1-210) and (−2110).

The depths of recesses or the steps of protruding portions are 50 Å or more, and it is important for them to be equal to or less than the dimension of the thickness of the semiconductor layer made to grow on the substrate. The depths or the steps must be at least λ/4 or more when the wavelength of the emitted light (for example, 206 nm to 632 nm in the case of an AlGaInN-based light emitting layer) is λ in order to sufficiently scatter or diffract light. However, the depths of the recesses or the steps of protruding portions becomes larger than the thickness of the semiconductor layer, which is made to grow on the substrate, it becomes difficult for a current to flow in the lateral direction within the layered structure so that the efficiency of the light emission is lowered. The surface of the semiconductor layer may have recesses and/or protruding portions. Though it is preferable for the depths or the steps to be of λ/4 or more in order to sufficiently scatter or diffract light, depths or steps of λ/4n (n is the index of the refraction of the semiconductor layer) or more can gain the effects of scattering or diffraction.

It is important for the size of the recesses and/or protruding portions (that is to say, the length of one side that becomes a component side of a recess and/or protruding portion) and for the intervals between the recesses anchor protruding portions to be at least the size of λ/4 or more when the wavelength in the semiconductor is λ (380 nm-460 nm). This is because, unless the size is at least λ/4 or more, light cannot be sufficiently scattered or diffracted. Though it is preferable for the size of, and the intervals between, the recesses and/or protruding portions to be of λ/4 or more in order to sufficiently scatter or diffract light, size or intervals of λ/4n (n is the index of the refraction of the semiconductor layer) or greater, can gain the effects of scattering or diffraction. The size of, and the intervals between, the recesses and/or protruding portions may be 100 μm or less from the point of view of manufacturing. Furthermore, it is preferable for the size of, and the intervals between, the recesses and/or protruding portions to be recesses 20 μm or less in order to increase the scattering surfaces.

Since the total film thickness of the semiconductor layers is, in general, 30 μm or less, it is preferable for the pitch of the unevenness to be 50 μm or less from the point of view of effective reduction in the number of total reflection due to scattering or diffraction. Furthermore, it is preferable for the pitch of the unevenness to be 20 μm or less from the point of view of the crystallinity of GaN layer. More preferably, the pitch of the unevenness are less than 10 μm. This increases a scattering efficiency and an out-put power of a device. Here, the pitch of the unevenness indicates the minimum distance from among the distances between the centers of the neighboring recesses or of the neighboring protruding portions.

Next, as for the shape of the unevenness in the cross section, it is preferable for a protruding portion to be a trapezoid and for a recess to be a reverse trapezoid, as shown in FIG. 9. Such a shape in the cross section enhances the efficiency of scattering and diffraction of light. It is not necessary to make the shape in the cross section completely trapezoidal or reverse trapezoidal. The edge of the trapezoid may be rounded during forming the unevenness. Here, a taper angle θ indicates, in the case of protrusions, the angle between the top and side surface, and, in the case of recesses, the angle between the bottom and side surface, as shown in FIG. 9. For example, if the angle θ is 90 degrees, the protrusions or recesses has a square cross section. If the angle θ is 180 degrees, the protrusions or recesses are flattened. In order to fill the unevenness by the semiconductor, the taper angle θ should be larger than 90 degrees. From the view point of increasing the output power by the scattering or diffraction, the taper angle θ is preferably more than 90 degrees, more preferably more than 105 degrees, much more preferably more than 115 degrees. On the other hand, too large taper angle decreases a scattering efficiency and induces pits in semiconductor layers. The taper angle is preferably not more than 160 degrees, more preferably not more than 150 degrees, much more preferably not more than 140 degrees.

Here, in the case that the sides of recesses and/or protruding portions are inclined, the sides and the intervals of the unevenness is defined by the length in the top surface of the substrate (upper surface of protruding portions in the case of protruding portions and flat surface of the substrate in the case of recesses).

In the present invention, it is preferable to form a metal layer with openings as an ohmic electrode. In the case an electrode entirely covering the surface of the semiconductor layer and having openings is formed on semiconductor layers, the electrode could cooperate with the unevenness on the substrate to remarkably increases the utilization efficiency of the light. Especially, it is preferable that each openings include at least one step portion of the unevenness on the substrate. The reason of this is assumed as follows: First, when the light emitting device having the unevenness on its substrate is observed from the front, step portions of the protrusions and/or recesses seems brighter than flat portions of the substrate. Accordingly, if openings are formed above the step portions of the protrusions and/or recesses, the output power of the device is remarkably improved. Second, in a device having the unevenness on the substrate, light that inherently propagates laterally or downwardly is scattered or diffracted to go upwardly. However, if a conventional transparent electrode is formed to cover the entire surface of the device, the scattered or diffracted light is partly absorbed and weakened by the electrode. Accordingly, on a semiconductor layer on a substrate with the unevenness, an electrode, which may be either transparent or opaque, with openings are preferably formed to expose a part of the semiconductor layer. This helps the scattered or diffracted light to go out of the device and improves the efficiency of the light utilization.

In the case of the gallium nitride semiconductor, including a semiconductor having at least gallium and nitrogen, a portion near the peripheral of the p-side electrode, which is formed on the p-type semiconductor layer, lights brighter than other portions. By forming openings in the electrode, not only the light absorption is decreased, but also the length of the peripheral of the p-side electrode, where the light strongly emits, is increased. Therefore, the efficiency of the light utilization is improved. It is preferable for $L/S \geq 0.024$ $\mu/\mu m^2$ to be fulfilled wherein the total area of the ohmic electrode including the openings is S and the total sum of the length of the inner periphery of the openings is L. This improves the efficiency of the light utilization, by increasing the length of the peripheral of the electrode.

As for a material favorable for the ohmic electrode with openings, an alloy or a multilayer film including at least one type selected from the group consisting of Ni, Pd, Co, Fe, Ti, Cu, Rh, Au, Ru, W, Zr, Mo, Ta, Pt, Ag and oxides of these as well as nitrides of these can be cited. Especially an alloy or a multiplayer film including one type selected from Rhodium (Rh), Iridium (Ir), Silver (Ag) and Aluminum (Al) is preferable.

DESCRIPTION OF THE PREFERRED EMBODIMENTS

Figure 1:
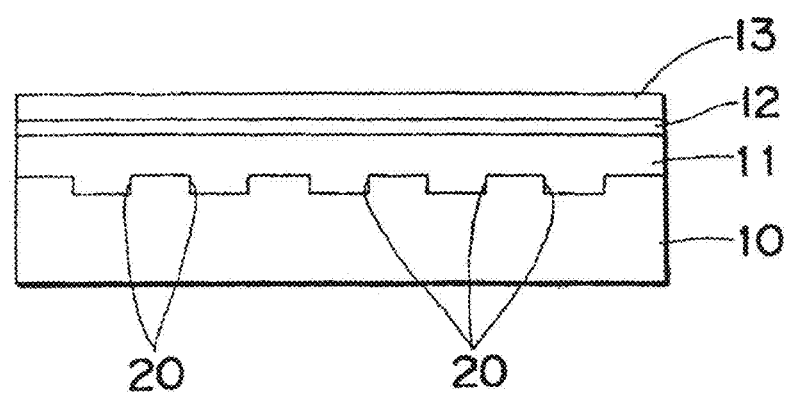
FIG. 1 is a cross sectional view showing a semiconductor light emitting device according to a preferred embodiment of the present invention.
Figure 2:
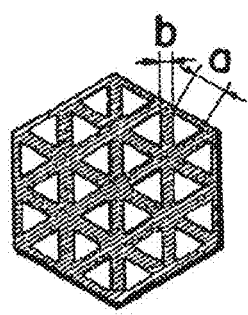
FIG. 2 is a view showing an example of a pattern of a recess according to the above-described embodiment.

In the following the present invention is described in detail based on the concrete examples shown in the drawings. FIGS. 1 and 2 show a semiconductor light emitting device according to a preferred embodiment of the present invention. In these figures a C plane (0001) sapphire substrate having an orientation flat in the A plane (11-20) is used as a substrate 10 while recesses 20 are created in a repeated pattern in the surface portion of this sapphire substrate 10 In FIG. 2 the substrate is etched so that the hatched portion remains.

Figure 3:
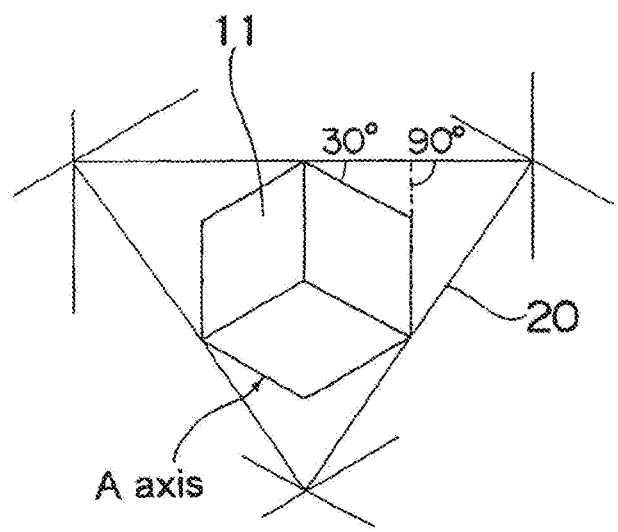
FIG. 3 is a schematic view showing relationships between a stably growing face of a nitride semiconductor and a shape of a recess.

This recess 20 forms an equilateral triangle having a vertex in a plane parallel to the stably growing face (1-100), (01-10), (−1010) of the GaN-based semiconductor 11, which grows on the sapphire substrate 10, that is to say, the M plane and having, as a component side, a line that crosses a plane approximately parallel to the above-described stably growing face. That is to say, from a top view of the substrate, an equilateral triangle that forms a recess 20 has a vertex at a position wherein the M plane cross each other and each component side of the equilateral triangle crosses the M plane at an angle of 30 degrees or 90 degrees. More concretely, as shown in FIG. 3, each component side of a recess 20 is perpendicular to a line segment connecting the center of a regular hexagon having the M plane of GaN semiconductor 11 as a component side and the vertex when recess 20 is viewed from above. When observed from directly above the substrate, M faces of the GaN-based semiconductor are parallel to A axis.

In addition, the depth of recess 20 is approximately 1 μm and, as for the size thereof, one side "a" is 10 μm while, as for the intervals between recess 20 and recess 20, one side corresponds to an interval is 10 μm.

An n-type GaN-based semiconductor layer 11, an MQW light emitting region 12 on n-type GaN-based semiconductor layer 11 and furthermore, a p-type AlGaN/p-type GaN-based semiconductor 13 on MQW light emitting region 12 are formed on top of the above-described sapphire substrate 10.

Figure 4A:
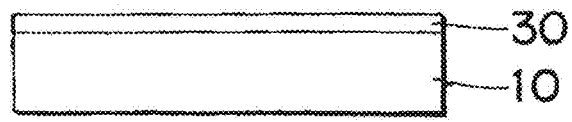
FIGS. 4(a)-4(e) present views showing manufacturing steps of the first embodiment.

In the case that a semiconductor light emitting device according to this example is manufactured, an $SiO_2$ film 30 that becomes an etching mask is formed sapphire substrate 10, as shown in FIG. 4A.

Figure 4B:
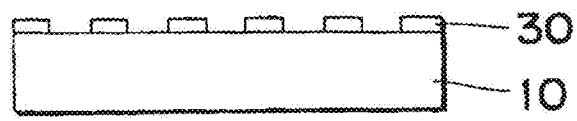
Figure 4C:
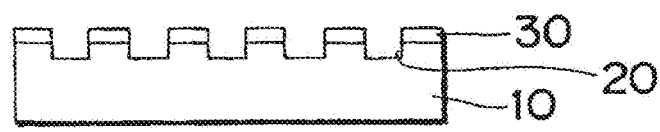
Figure 4D:
Figure 4E:
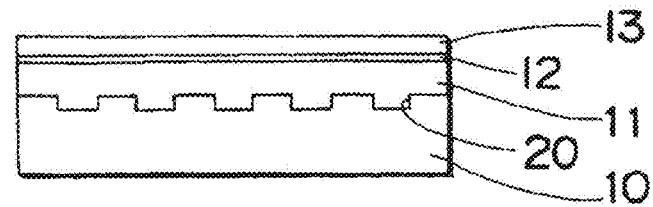

Next, a photomask in the shape of an equilateral triangle having a side of 10 μm is utilized and the photomask is adjusted so that one side of the equilateral triangle becomes perpendicular to the orientation flat, wherein each side of the equilateral triangle becomes approximately parallel to the plane (1-100), (01-10), (−1010), that is to say, the M plane, of the sapphire so that $SiO_2$ film 30 and sapphire substrate 10 are etched by approximately 1 μm by means of RIE, as shown in FIGS. 4B and 4C, and after that, $SiO_2$ film 30 is removed, as shown in FIG. 4D, so that a repeated pattern of recesses 20, as shown in FIG. 2, is formed in the surface portion of sapphire substrate 10.

An n-type GaN semiconductor layer 11, an MQW light emitting region 12 on-type GaN semiconductor layer 11 and a p-type AlGaN/p-type GaN semiconductor layer 13 on MQW light emitting region 12 are made to grow on top of sapphire substrate 10 having the repeated pattern of recesses 20.

Since the lattice of GaN grows with a shift of 30 degrees from a lattice of sapphire substrate 10, the repeated pattern of recesses 20 formed on sapphire substrate 10 forms a polygon having sides approximately parallel to the A plane of GaN (11-20), (1-210), (−2110), having a vertex in the stably growing face of GaN (1-100), (01-10), (−1010) and not having a line parallel to the stably growing face of GaN (1-100), (01-10), (−1010), that is to say; the M plane.

Figure 5A:
FIGS. 5(a) and 5(b) present SEM photographs for observing processes of the growth of gallium nitride on a sapphire substrate wherein protruding portions are created.
Figure 5B:
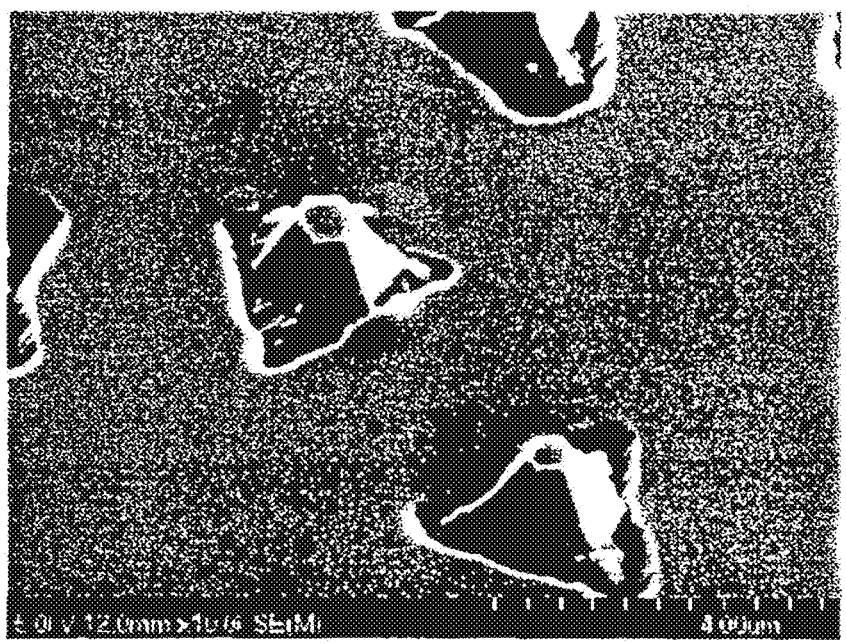

These arrangements improves the crystallinity of GaN. The mechanism of improving crystallinity will now be discussed with an example of protruding portions, since the mechanism is the same as in the case of recesses. FIGS. 5A and 5B are SEM photographs of GaN during the process of growth on top of sapphire substrate 10 wherein protruding portions 20 in an equilateral triangle shape are created wherein FIG. 5A shows a view as observed from above while FIG. 5B shows a diagonal view from above. As shown in FIGS. 5A and 5B, when GaN is made to grow on the sapphire substrate 10, the growth of GaN progresses from the top surface of protruding portions 20 and from the flat surface wherein protruding portions 20 are not created so that the side surfaces and the vicinity thereof of protruding portions 20 are finally filled in with GaN. Accordingly, in the case that the stably growing face of GaN and the sides of protruding portions 20 are parallel to each other, it becomes difficult for the sides and vicinity of protruding portions 20 to become filled in with GaN so that the crystallinity of GaN is lowered.

Therefore, it is preferable to form component sides of protruding portions 20 to cross (not to become parallel to) the M plane, which is the stably growing face of GaN. Furthermore, it is preferable, as shown in FIGS. 5A and 5B, for the component sides of protruding portions 20 to be formed so as to be perpendicular to the line segment connecting the center of a hexagon having the M plane, which is the stably growing face of GaN, as component sides and the vertex. By creating protruding portions 20 in such a manner, GaN having an excellent crystallinity that fills in the inside of protruding portions 20 to provide flatness can be gained.

It is assumed that this is because the growth rate of GaN becomes higher in a portion wherein GaN that has grown from the top surfaces of protruding portions 20 and GaN that has grown from the flat surface wherein protruding portions 20 are not created make a junction. As shown in FIG. 5B, GaN has grown from the top surfaces of protruding portions 20 in the shape of a hexagon having the M plane as component sides. The growth rate of GaN becomes higher in the vicinity of the side planes of protrusions, where GaN that has grown from the top surfaces of protrusions 20 and GaN that has grown from the flat surface make contact. Accordingly, the growth of GaN in the vicinity of the sides of protruding portions catches up with that in the other regions and thereby, flat GaN is gained.

Figure 6A:
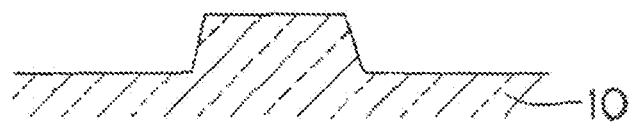
FIGS. 6(a)-6(f) present diagrams showing processes of the growth of gallium nitride on a sapphire substrate wherein a protruding portion is created.
Figure 6B:
Figure 6C:
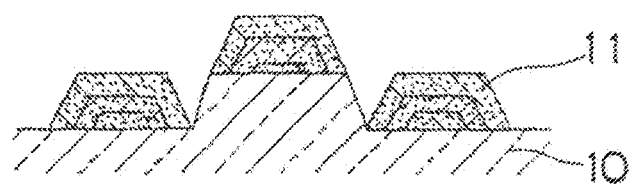
Figure 6D:
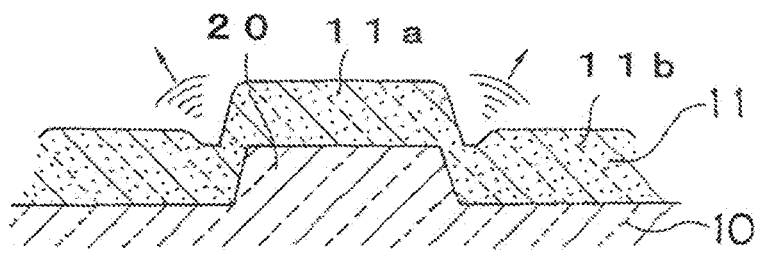
Figure 6E:
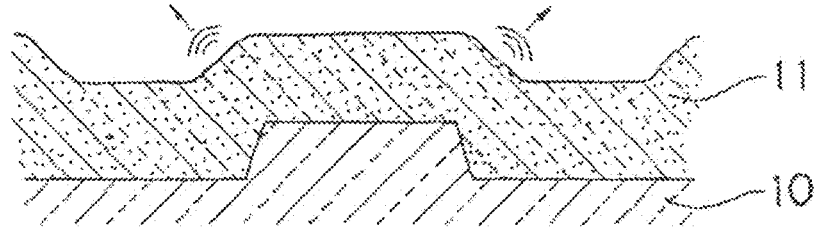
Figure 6F:
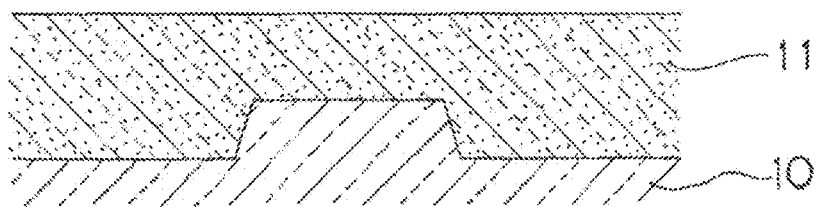

This is schematically described using FIGS. 6A to 6F When, as shown in FIG. 6A, protruding portions 20 are created in sapphire substrate 10 and GaN is made to grow on top of that, GaN grows, as shown in FIGS. 6B and 6C, from the top surfaces of protruding portions 20 and from the flat surface in which protruding portions 20 are not created, while growth slows in the vicinity of the sides of protruding portions 20. As shown in FIGS. 6D and 6E, however, when GaN 11a, which has grown from the top surfaces of protruding portions 20, and GaN 11b, which has grown from the flat surface, meet, the growth rate of GaN becomes higher there. Therefore, the growth significantly progresses in the vicinity of sides of protruding portions 20, wherein growth had been behind. Then, as shown in FIG. 6F, GaN 11 having flatness and an excellent crystallinity grows. On the contrary, in the case that the surface on which GaN stable grows and the sides of protruding portions 20 are parallel to each other, the growth rate does not increase in the vicinity of the sides of the protruding portions 20 and therefore, it becomes difficult to fill in the vicinity of the sides of recesses 20 so that the crystallinity of the GaN is lowered.

After that, a device process is carried out and electrodes and the like are appropriately formed so that LED chips completed.

When holes and electrons are injected from n-type GaN semiconductor layer and p-type AlGaN/p-type GaN semiconductor layer 13 to MQW light emitting region 12 so that recombination is carried out, light is generated. This light is emitted from sapphire substrate 10 or p-type AlGaN/p-type GaN semiconductor layer 13.

Figure 7A:
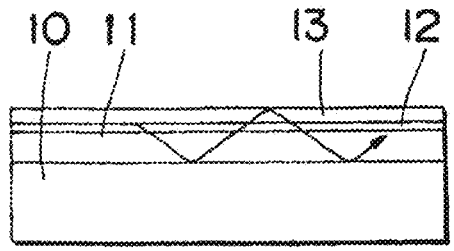
FIGS. 7(a)-7(d) present diagrams schematically showing manners of propagation of light according to the present invention in comparison with those in conventional structures.

In the case of a semiconductor light emitting device having a conventional flat substrate, as shown in FIG. 7A, when light from light emitting region 12 enters the interface between p-type semiconductor layer 13 and the electrode or the surface of substrate 10 at an angle larger than the critical angle, light is trapped within the light guide so as to propagate in the lateral direction.

Figure 7C:
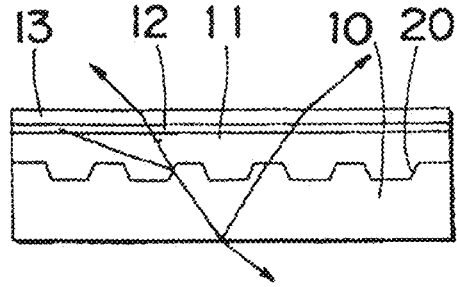
Figure 7B:
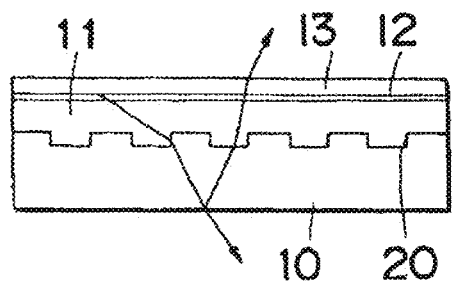

On the contrary, in a semiconductor light emitting device of the present example, light entering the interface between p-type semiconductor layer 13 and the electrode or the surface of substrate 10 at an angle larger than the critical angle is scattered or diffracted by recess 21, as shown in FIG. 7B, to enter the interface between p-type semiconductor layer 13 and the electrode or the surface of substrate 10 at an angle less than the critical angle to be emitted.

In the case that the contact electrode on p-type semiconductor layer 13 is a light transmitting electrode, the present example is effective for an FU (face up) semiconductor light emitting device and, in the case that the contact electrode is a reflecting electrode, the present example is effective for an FD (face down) semiconductor light emitting device. However, if a reflecting electrode has apertures, the present example may be used with an FU type. This embodiment is especially effective.

Figure 8A:
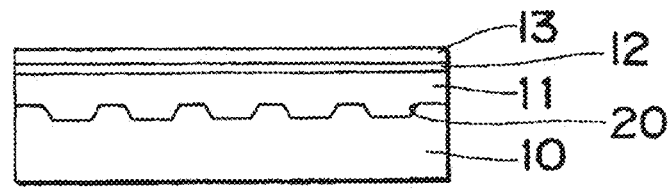
FIGS. 8(a)-8(c) present sectional views taken from planes that are orthogonal to the surface of the substrate, additionally showing other embodiments.
Figure 8B:
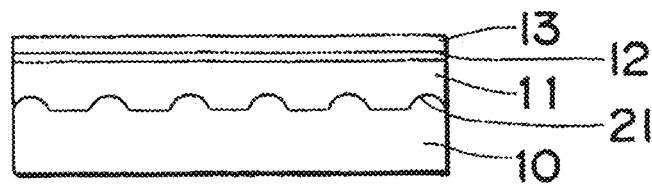
Figure 8C:
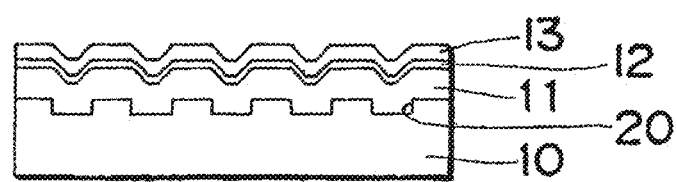

FIG. 8 shows a semiconductor light emitting device according to another embodiment of the present invention. The device is formed so that the sides of the steps of recesses 20 are inclined in the embodiment shown in FIG. 8A. In addition, protruding portions 21, in place of recesses 20, are formed on the surface portion of substrate 10 in the embodiment shown in FIG. 8B and, in this example, protruding portions 21, of which the cross sections are of a semicircular shape, are formed. Furthermore, an n-type semiconductor layer 11, a light emitting region 12 and a p-type semiconductor layer 13 form planes with recesses in accordance with recesses 20 in the embodiment shown in FIG. 8C.

Figure 7D:
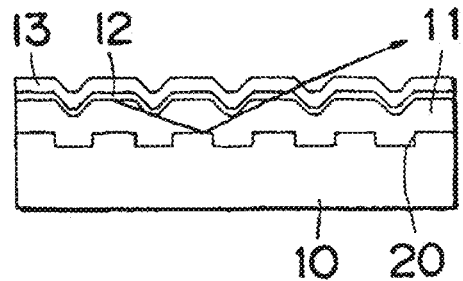

FIGS. 7C and 7D show examples of light propagation in the embodiments shown in FIGS. 8A and 8C. It can be seen that light is efficiently emitted in both cases. In particular, surfaces (sides of recesses or of protruding portions) connected to the surfaces of protruding portions and to the surfaces of recesses having lines (also referred to as the component sides of a polygon), which cross a plane approximately parallel to the stably growing face of the semiconductor layers as interfaces, are formed so as to be inclined relative to the direction in which the semiconductor is layered, as shown in FIG. 8A and thereby, the effects of light scattering or light diffraction notably increase so that the efficiency of light emission significantly increases. It is considered that one factor contributing to this is an increase in the number of occurrences of light scattering or light diffraction due to increase in the area of the surfaces (sides of recesses or of protruding portions) connected to the surfaces of recesses and to the surfaces of protruding portions as a result of the provision of the inclination.

Figure 9:
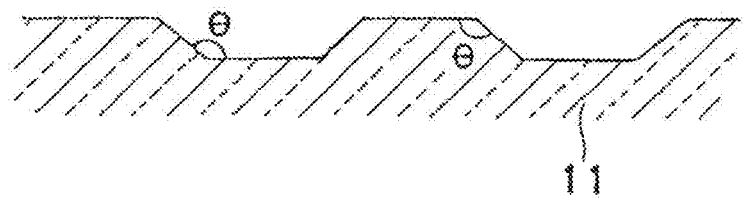
FIG. 9 is a cross-sectional view of the recess and/or protruding portions.

In other words, it is preferable for the shape of the unevenness in the cross section to be a trapezoid in the case of a protruding portion and to be a reversed trapezoid in the case of a recess, as shown in FIG. 9. By providing such a shape in the cross section, the probability of occurrence of scattering and diffraction of propagated light is increased so that the absorption loss of light at the time of propagation can be reduced. Here, the taper angle of the sides of recesses and/or protrusions indicates, as shown in FIG. 9, the angle formed between the top surface and a side in the case of a protruding portion and angle formed between the bottom surface and a side in the case of a recess. For example, if the taper angle is 90 degrees, the cross section of the protrusions and/or recesses will be a square, and if the angle is 180 degrees, the protrusions and/or recesses will become flat.

In order to fill the unevenness by semiconductor layers, the taper angle of the protrusions and/or recesses must not be less than 90 degrees. From the view point of improving an output power by an unevenness, the taper angle of the sides of recesses and/or protruding portions is preferably more than 90 degrees, more preferably more than 105 degrees, much more preferably more than 115 degrees. On the other hand, too large taper angle decreases a scattering efficiency and induces pits in semiconductor layers. The taper angle is preferably not more than 160 degrees, more preferably not more than 150 degrees, much more preferably not more than 140 degrees.

Figure 10:
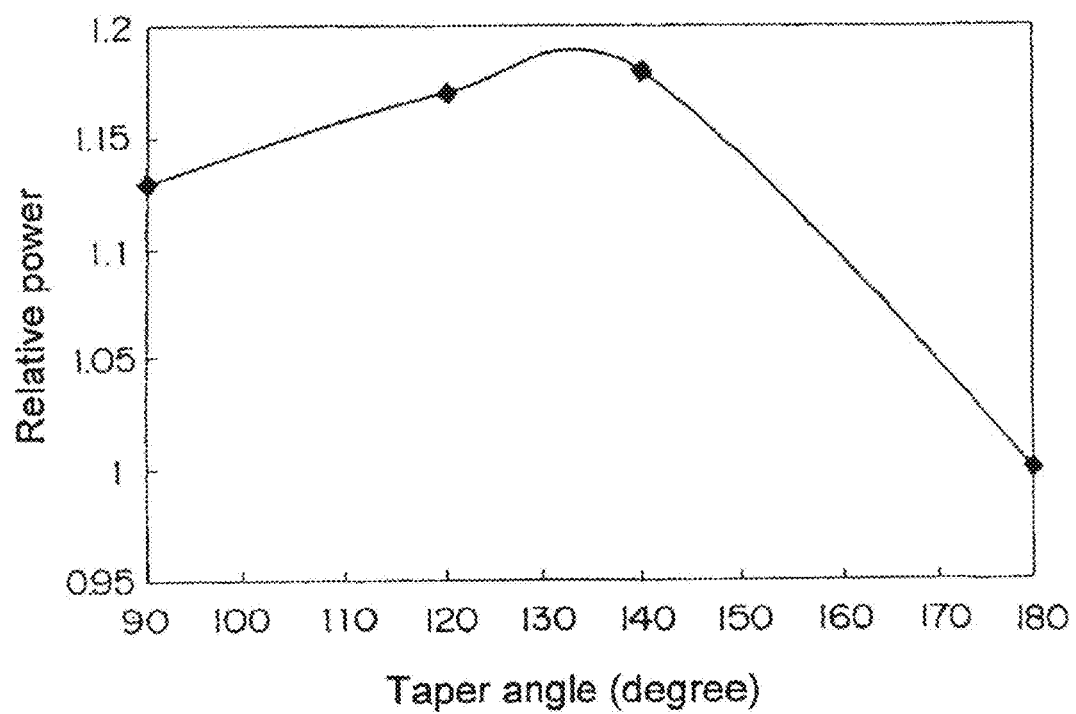
FIG. 10 is a graph showing the relationships between the angle of inclination of a side of a recess and the output of emitted light.

FIG. 10 is a graph showing the relationships between the angle of inclination of the sides of recesses and the LED power. Here, a similar tendency as in the graph can be gained when the angle of inclination is regarded as that of the sides of the protruding portions. The longitudinal axis of the graph of FIG. 10 indicates the ratio of output in the case that the LED output when a flat substrate (=taper angle is 180 degrees) is used is set as 1 while the lateral axis of the graph indicates the angle of inclination of the sides of recesses. As shown in the graph, the output of the LED changes significantly when the angle of inclination (angle formed between the bottom surface of a recess and a side) is changed between 90 degrees and 180 degrees.

FIG. 11 shows examples of other shapes of recesses 20 or protruding portions 21. In the figure, the hatched portions are the portions that are not etched. For example, in FIG. 11C, six triangle protrusions (hatched) form a hexagon so as to surround another triangle protrusion.

Figure 12A:
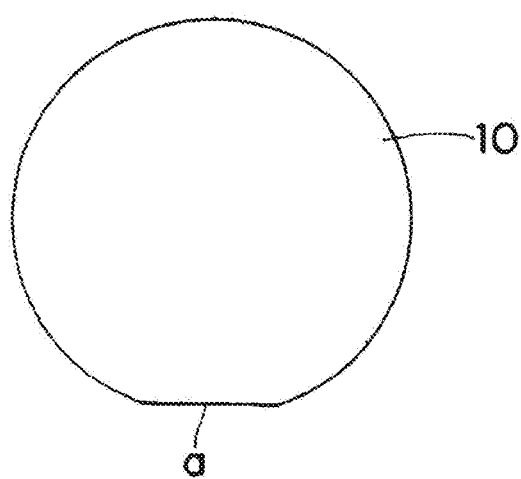
FIGS. 12(a)-12(c) present diagrams for describing other embodiments wherein a recess or a protruding portion is a regular hexagon.
Figure 12B:
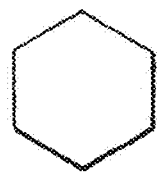
Figure 12C:
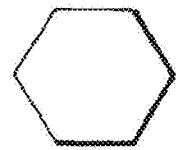

In addition, in the case that recesses 20 or protruding portions 21 are regular hexagons, the regular hexagons are placed in the direction shown in FIG. 12B, not in the direction shown in FIG. 12C, relative to orientation flat surface A of sapphire substrate 10 shown in FIG. 12A. As described above, in the case that GaN is made to grow on the C face of the sapphire substrate, the A face of the sapphire substrate and the M face of GaN become parallel to each other, when observed from above the substrate. Accordingly, the regular hexagons having uneven surfaces are arranged as shown in FIG. 12B and thereby, each of the component sides of the regular hexagons becomes perpendicular to any of surface M, which is the stably growing face of GaN. In other word, the hexagonal protrusions and/or recesses have the component sides that are perpendicular to a segment that connects the center and vertex of the hexagon having the M face of GaN as its component side.

In addition, according to the present invention, a conventional semiconductor layer, such as a nitride semiconductor layer, is formed on a substrate in which unevenness is provided so that defects do not occur in the semiconductor and additionally, electrodes and the like axe formed in a device, wherein, though other parts of the configuration are not specifically limited, remarkable effects are additionally gained by making the other parts of the configuration be as follows.

(1) Form and Material of Electrode

<1> Open Electrode

It is necessary to provide an electrode on top of the semiconductor layer on the surface of a semiconductor light emitting device and generally, a transparent electrode is formed on the entirety of the surface of the semiconductor layer when the semiconductor layer is a semiconductor layer having a comparatively high specific resistance wherein current dispersion hardly occurs, such as in a p-type nitride semiconductor layer. However, at the time when light propagates within the light guide formed in the structure of a light emitting electrode-semiconductor layer-substrate, emitted light is absorbed or attenuated by not only the semiconductor layer but, also, by the light transmitting electrode and by the substrate as a result of the effects of "leakage" of reflected light. In particular, a transparent electrode significantly affects the attenuation of emitted light because the general component materials thereof (Au/Ni, for example) has a high ratio of light absorption in the short wavelength range.

Therefore, it is preferable to form, as an electrode, a metal film having an opening in a light emitting device according to the present invention. Especially, it is preferable that each opening has in its inside at least one step portion of the unevenness of the substrate. By forming an electrode with openings on the semiconductor layers, the openings let the light go through so that the absorption by the electrode is reduced. It is preferable that a plurality of openings is formed in the metal layer. From the view point of improving an efficiency of light utilization, it is also preferable to make the area of the openings as large as possible. On the electrode with openings, a pad electrode for connecting the device with an outer circuit is preferably formed.

In addition, in the case of a nitride semiconductor light emitting device, in particular, in the case of a gallium nitride-based (at least gallium and nitrogen are included) semiconductor light emitting device, an electrode having light transmission, preferably through the entirety of the surface, is, in many cases, provided as a p electrode on the p-type nitride semiconductor layer and then, the device exhibits the property wherein the light absorption in the light emitting electrode becomes great so that the periphery and the vicinity of the periphery of the p electrode provided on the p-type nitride semiconductor layer emits light that is more intense than that emitted from other parts of the device. Therefore, openings may be provided in the light transmitting electrode. Thereby, light absorption is reduced and the peripheral portion that emits intense light is increased in area so that the efficiency of light emission is increased. In this case, it is preferable for the area of the openings to be provided as large as possible from the point of view of increase in the efficiency of the light emission and by making the length of the peripheral portion of the p electrode as long as possible, the efficiency of the light emission is further increased.

It is preferable for the electrode formed on the surface of the semiconductor layer to be an electrode having an opening, as described above, because the effect of recesses and/or protruding portions on the surface of substrate is much higher with an electrode having an opening. There may exist two reasons. First, when observed from the front of the device, the brightness of edges of recesses and/or protruding portions is higher than other portions. Therefore, by forming the openings above the edges of the recesses and/or protrusions, the output power is considerably increased. Second, light that has reached to upper areas through scattering or diffraction has a low intensity. Therefore, most of the light that has reached to upper areas through scattering or diffraction is absorbed by the light transmitting electrode in the configuration wherein a conventional light transmitting electrode is provided on the entirety of the surface. In the case that a semiconductor layer is formed on a substrate wherein unevenness is provided, openings are provided in the light transmitting electrode or a non-light transmitting electrode so that the semiconductor layer is partially exposed and thereby, light having a low intensity is easily emitted to the outside so as to significantly increase the efficiency of light emission.

<2> Material for Open Electrode

As described above, in the case of a nitride semiconductor light emitting device, in particular, in the case of a gallium nitride-based (at least gallium and nitrogen are included) semiconductor light emitting device, an electrode having light transmission almost the entirety of the surface of a p-type nitride semiconductor layer is provided as a p electrode and in a more favorable embodiment, an electrode provided with openings is formed on almost the entirety of the p-type nitride semiconductor layer so that the efficiency of the light emission is increased. At this time, a metal or an alloy made of two types of metal is used as a material used in the electrode and a single layer or a plurality of layers can be formed. A metal material of a high reflectance for at least the wavelength of the emitted light is preferably used as the material for this electrode. This reduces the components of light absorbed by the electrode so that the efficiency of the light emission to the outside can be increased.

As for a material favorable for the open electrode, an alloy or a multilayer film including at least one type selected from the group consisting of Ni, Pd, Co, Fe, Ti, Cu, Rh, Au, Ru, W, Zr, Mo, Ta, Pt, Ag and oxides of these as well as nitrides of these can be cited. An external ohmic contact can be gained between the above and a p-type semiconductor layer by annealing the above at a temperature of 400° C., or higher. In particular, a multilayer film wherein Au is layered on Ni is preferable. As for the total film thickness of the open electrode, 50 Å to 10000 Å is preferable. In particular, in the case that a light transmitting electrode is used, 50 Å to 400 Å is preferable. In addition, in the case that a non-light transmitting electrode is used, 1000 Å to 5000 Å is preferable.

Rhodium (Rh), iridium (Ir), silver (Ag), aluminum (Al) and the like can be cited as a metal materials of a high reflectance which are used, specifically, in a reflecting electrode in a gallium nitride-based (at least gallium and nitrogen are included) semiconductor light emitting device.

It is specifically preferable to use Rh as the material of the open electrode. The electrode can be thermally stabilized and can have a low light absorption by using Rh. In addition, the contact resistance can be lowered.

<3> Size and Form of Open Electrode

Though the relationships concerning the size of the openings of the electrode and the size of the recesses or protruding portions on the surface of the substrate are not specifically limited, it is preferable for at least two or more edges of recesses or protruding portions to be created within one opening. Thereby, the light scattered or diffracted by the unevenness can be effectively emitted and at the same time, the uniformity of the light emission increases.

In addition, the open electrode is an electrode having a plurality of openings that penetrate to the surface of the p-type semiconductor layer and that are surrounded by the electrode and it is preferable for $L/S \geq 0.024$ μm/μm² to be fulfilled wherein the area of a portion surrounded by the outermost peripheral portion (total area of the electrode including the openings) is S and the total sum of the length of the inner periphery of the openings is L. Thereby, a semiconductor light emitting device can be gained wherein light can be efficiently emitted from the surface of the p-type semiconductor layer to the outside and, in addition, Vf is low.

It is preferable for the respective openings of the plurality of openings to have approximately the same form and thereby, the creation of openings becomes easy and the distribution of emitted light within the surface becomes uniform. In addition, it is preferable for the respective openings to have approximately the same area and thereby, the distribution of the emitted light within the surface becomes uniform.

In the case that openings are formed in a thick layer, the shape, the size and the like of these openings is controlled so that the efficiency of the light emission can be enhanced and the efficiency of light generation can be increased. In particular, the more efficient emission of light becomes possible by controlling the length L of the inner periphery of the openings. When L/S becomes small, that is to say, when the total sum L of the length of the inner periphery of the openings becomes small relative to the area S surrounded by the outermost peripheral portion of the open electrode, the output to the p-type semiconductor layer side is lowered.

Figure 13:
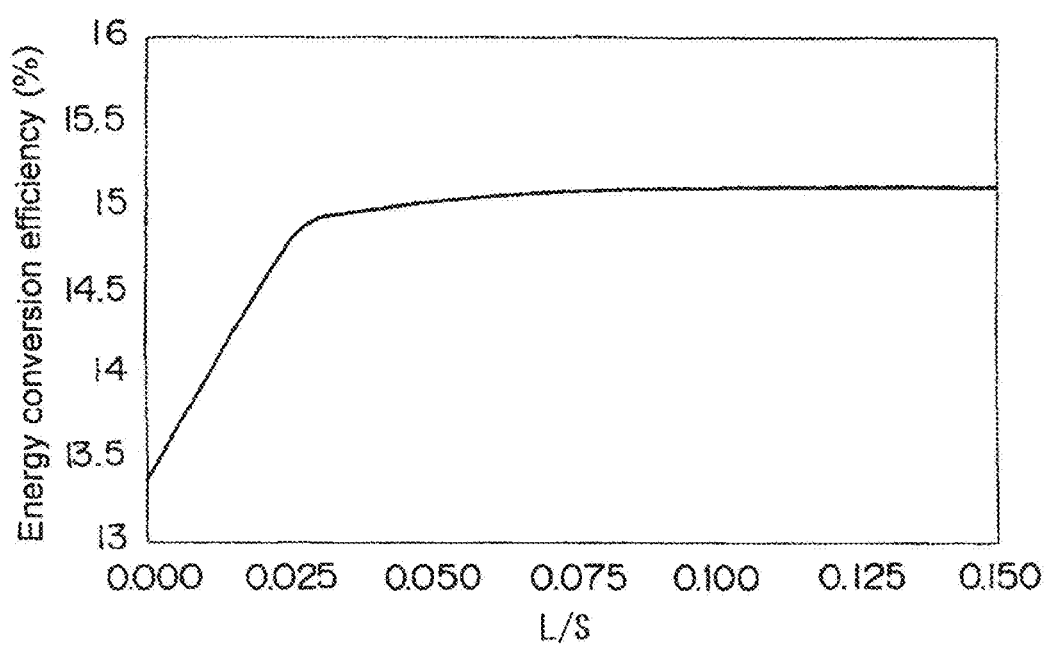
FIG. 13 is graph showing the relationships between L/S (ratio of inner circumference L of an opening to area S of p-side ohmic electrode) and the output of emitted light.

FIG. 13 shows the power conversion efficiency when the ratio of the openings remains the same, that is to say, when the total area of the openings remains the same while the length of the inner periphery is changed. The area of the openings remains the same and thereby, the contact area between the p-type semiconductor layer and the open electrode remains the same so that Vf and the quantum efficiency are considered to be the same. It is understood from this figure that output can be enhanced by changing the length of the inner periphery of the openings, even when the ratio of the openings remains the same. Then, according to the present invention, a semiconductor light emitting device of a high output can be gained by adjusting the length of the inner periphery of the openings in a range wherein $L/S \geq 0.024$ μm/μm² is fulfilled. Though the upper limit is not specifically set, in actuality when L/S becomes greater than 1 μm/μm², the size of one opening becomes too small and the device becomes impractical.

The reason why the output efficiency from the p-type semiconductor layer side is greatly affected by the length of the inner periphery of the openings rather than by the area of the openings as described above, is that an intense emission of light is observed at the boundary between the electrode and the p-type semiconductor layer and therefore, an enlargement of the boundary, that is to say, a lengthening of the inner periphery of the openings allows the efficient emission of light. In order to further enlarge the boundary, the outermost peripheral portion of the p-side ohmic electrode is formed in a line of a non-linear nature along the edge portion of the semiconductor layer, and thereby, the length of the boundary of the p-side ohmic electrode and the p-type semiconductor can be enlarged so that the output can be further increased.

A plurality of openings as described above can be created so that the respective openings have approximately the same shape and thereby, the plurality of openings can be efficiently created. Furthermore, the distribution of the openings within the surface are easily made uniform so that stable light emission can be gained. As for the shape of openings, a variety of shapes, such as rectangular, circular, triangular and the like can be used. The shape is preferably a square and a plurality of openings is created so that the openings are uniformly dispersed with constant spaces vis-à-vis the neighboring openings and thereby, it becomes easy to gain a uniform light emission. In addition, the plurality of openings is created so that the areas of the openings become approximately the same and thereby, a preferred opening shape can be selected depending on the position wherein an opening is created.

Figure 14A:
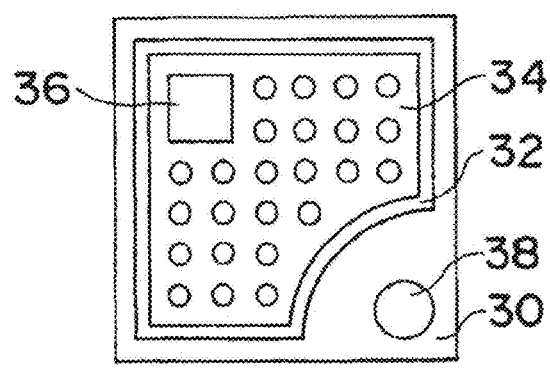
FIGS. 14(a)-14(d) present diagrams showing various variations of the mode of p-side ohmic electrode.
Figure 14B:
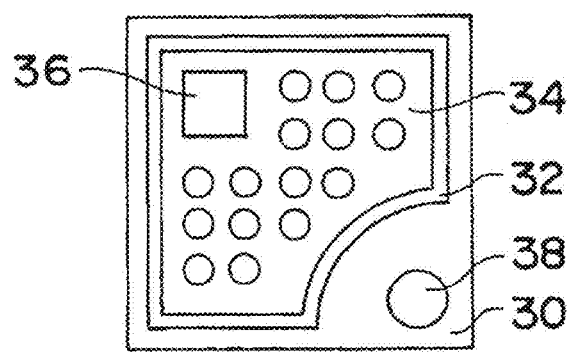
Figure 14C:
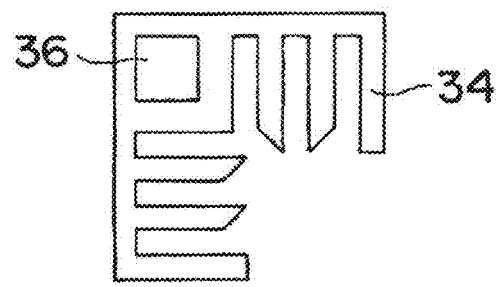
Figure 14D:
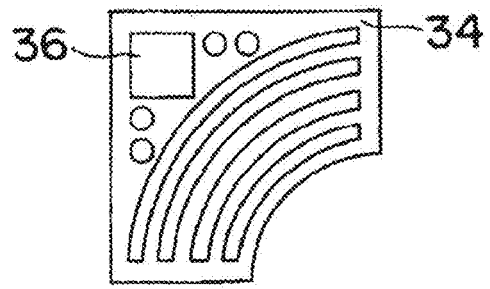

FIGS. 14A to 14D show preferred shapes of the open electrode. In FIG. 14A, a p-side semiconductor layer 32 is formed on an n-side semiconductor layer 30 and an open electrode 34, which is a p-side ohmic electrode, is formed on p-side semiconductor layer 32 and a p-side pad electrode 36 is formed as a portion of open electrode 34. In addition, an n-side pad electrode 38 is formed on n-side semiconductor layer 30 that has been exposed through the etching of p-side semiconductor layer 32. A plurality of circular openings is arranged in open electrode 34. FIG. 14B show open electrode with large size openings. FIG. 14C and FIG. 14D only shows the opening electrode 34 and the pad electrode 36. As shown in FIG. 14C, openings may be formed as slits, of which ends are open. In this case, the ohmic electrode is like a combination of a plurality of line electrodes. The openings are preferably formed so that currents are not concentrated locally. FIG. 14D shows a modified example of the shape of the openings, wherein a plurality of openings, in an arc form and arranged so as to be concentric, is provided with an n-side pad electrode (not shown) placed at the center. Such an opening shape enhances the uniformity of the emitted light.

Figure 15A:
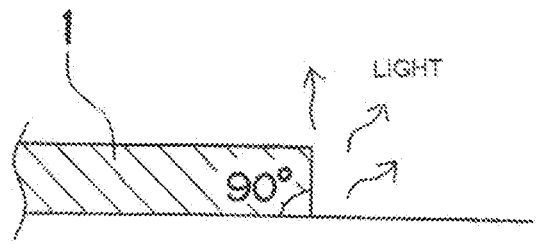
FIGS. 15(a) and 15(b) present schematic diagrams showing the relationships between the forms of cross sections of edge portions of the p-side ohmic electrodes and light emissions.
Figure 15B:
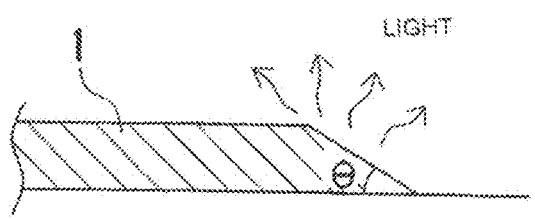

In addition, though the shape of the p-side ohmic electrode in the cross section of the edge portion may be vertical, as shown in FIG. 15A, it may, preferably, be a mesa (=trapezoid), as shown in FIG. 15B. In the case, particularly, of a gallium nitride-based compound semiconductor light emitting device, the device has a property wherein the intensity of the emitted. light is high at the peripheral portion of the p-side ohmic electrode and therefore, such a cross sectional edge portion form, that is to say, a mesa (=trapezoid) allows light to be efficiently emitted. In this case, it is preferable for the angle of taper θ of the cross sectional edge portion to be in the range of 30 degrees≤θ<90 degrees. In the case that the angle of taper is 30 degrees or less, the resistance value of the p-side ohmic electrode becomes great in the tapered portion and therefore, it becomes difficult to effectively utilize the property that the peripheral portion of the electrode emits intense light.

(2) Form of Semiconductor Light Emitting Device

According to the present invention, at least two semiconductor layers and a light emitting region, of which the materials differ from that of the substrate, are formed on the surface of the substrate in a layered structure. That is to say, the substrate and the semiconductor layers are made of different materials Here, in the case that an insulating substrate is used as the substrate, for example, in the case that a gallium nitride-based (at least gallium and nitride are included) semiconductor layer is formed on a sapphire substrate, an electrode cannot be formed on the substrate and therefore, it is necessary to form two electrodes of an n electrode and p electrode on the same side of the device. At this time, for example, a nitride semiconductor device formed, in this order, of an n-type semiconductor layer, a light emitting region, a p-type semiconductor layer is formed. By etching a portion of the p-type semiconductor layer until the surface of the n-type semiconductor layer is exposed. A p-side electrode is formed on the surface of the p-type semiconductor layer and an n-side electrode is formed on the exposed surface of the n-type semiconductor layer so that the respective electrodes are placed at the two vertexes diagonally opposite to each other of the semiconductor device in a square form, as shown in the top surface view of the semiconductor layer of FIG. 16.

In this case, light emitted to the outside from the sides of the semiconductor light emitting device is blocked by external connection terminals, such as the n-side electrode and a wire connected to the n-side electrode, formed on the sides by exposing the n-type semiconductor layer.

Figure 17:
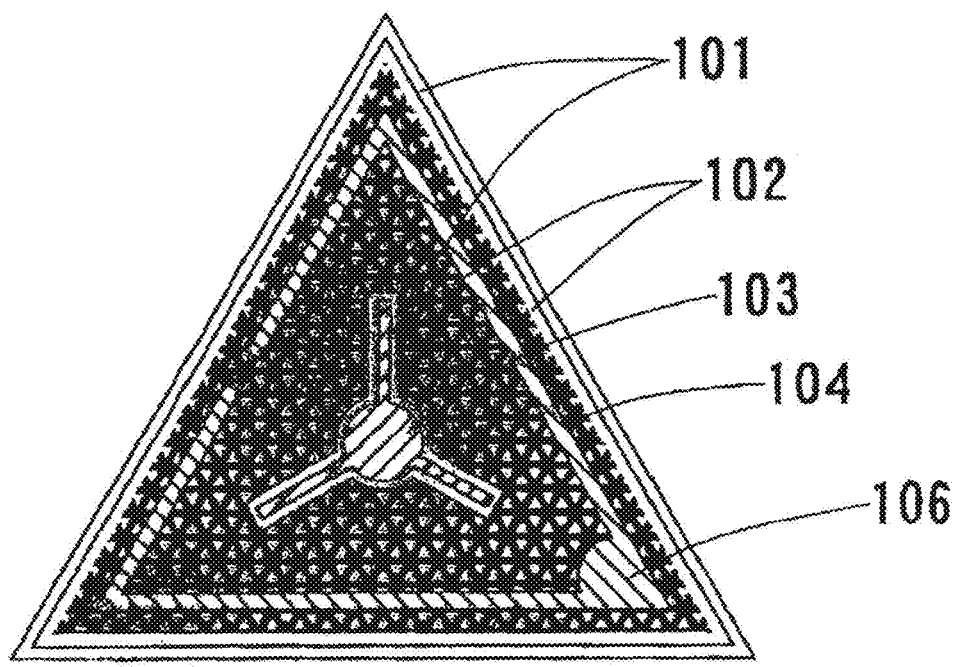
FIG. 17 is a view of a semiconductor light emitting device, viewed from above, according to still another embodiment of the present invention.

As shown in FIG. 17, n-type semiconductor layer exposed is located inside the p-type semiconductor layer so that the light emitting region that emits light between the n-type semiconductor layer and the p-type semiconductor layer is provided on the entirety of outer sides of the semiconductor light emitting device to increase the efficiency of light emission to the outside of the device. In the case of a device wherein a p-type semiconductor layer, a light emitting region and an n-type semiconductor layer are layered, in this order, on a substrate, the exposed surface of the p-type semiconductor layer is provided inside the n-type semiconductor layer so that the same effects can be gained.

In addition, as shown in FIG. 17, in the case an inner portion of one-type semiconductor layer is taken away with etching so that another-type of semiconductor layer is exposed, a branch electrode protruding from a pad electrode for diffusing current is preferably formed on the exposed semiconductor layer. This uniformalizes the current flow in the one-type semiconductor layer. In the case that the electrode with openings is formed, the branch of the pad may be formed on the electrode. More preferably, the branch is formed along the outer periphery of the semiconductor This further improves the uniformity of the light.

The external shape of the semiconductor light emitting device, as viewed from above, can be quadrangular, triangular or formed of other polygons. The exposed area of one-type semiconductor layer and the electrode formed on the exposed layer is preferably formed so that a portion thereof extends toward the vertex of the light-emitting device. This makes current flow uniformly and such a configuration is preferable because light emission in the light emitting region becomes uniform.

In the case that a light emitting device of the present invention is, for example, a gallium nitride-based (at least gallium and nitride are included), mixture of fluorescent material including YAG and a resin are preferably formed on the surface of the light emitting device, in order to gain a white light emitting device having a high efficiency. A light emitting device having a variety of wavelengths of emitted light and having a high efficiency of light emission is provided by appropriately selecting the fluorescent material.

The p-side electrode and the n-side electrode used in the present invention are the electrodes formed so as to contact with at least the semiconductor layers and the materials thereof are appropriately selected to provide excellent ohmic properties for the contacted semiconductor layers.

Example 1

A sapphire substrate, of which a C plane (0001) is used as the main surface, having the orientation flat in an A plane (11-20), is used as the substrate.

First, an $SiO_2$ film 30 that becomes an etching mask is formed on a sapphire substrate 10, as shown in FIG. 4A.

Figure 11A:
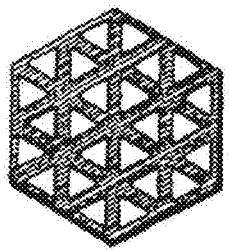
FIGS. 11(a)-11(n) present examples of other patterns of a recess or of a protruding portion.
Figure 11F:
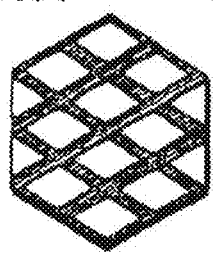
Figure 11K:
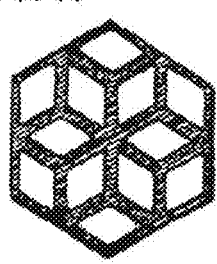
Figure 11B:
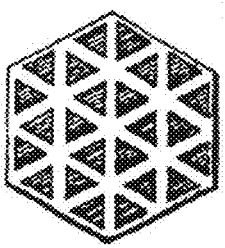
Figure 11G:
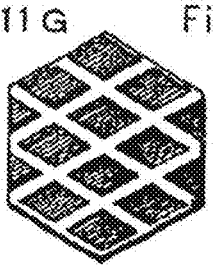

Next, a photomask of an equilateral triangle having a side of 5 μm is utilized and the photomask is arranged so that one side of the equilateral triangle becomes perpendicular to the orientation flat while the respective sides of the equilateral triangle become approximately parallel to (1-100), (01-10) and (-1010), that is to say, an M plane and then, after $SiO_2$ film 30 and sapphire substrate 10 are etched by 3 μm to 4 μm using ME, as shown in FIGS. 4B and 4C, a repeating pattern of protruding portions 20 (hatched areas are unetched areas, that is to say, protruding portions), as shown in FIG. 11B, is formed in the surface portion of sapphire substrate 10 when $SiO_2$ film 30 is removed as shown in FIG. 4D. As for the length a of one side of a recess, a 5 μm and as for an interval b between a recess and a recess, b=2 μm. The pitch between protruding portions (distance between the centers of neighboring protruding portions) is 6.3 μm. In addition, the angle of inclination of a side of a recess is 120 degrees.

Next, a buffer layer 14, which is made to grow at a low temperature, of $Al_xGa_{1-x}N$ (0≤x≤1), of 100 Å, is layered as an n-type semiconductor layer on sapphire substrate 10 wherein the repeating pattern of protruding portions 20 is formed and undoped GaN of 3 μm, Si doped GaN of 4 μm and undoped GaN of 3000 Å are layered and then, six well layers and seven barrier layers, having respective film thicknesses of 60 Å and 250 Å, wherein well layers are undoped InGaN and barrier layers are Si doped GaN, are alternately layered as an active layer of a multi quantum well that becomes the light emitting region In this case, the barrier layer that is finally layered may be of undoped GaN. Here, the first layer formed on the buffer layer grown at a low temperature is made of undoped GaN and thereby, protruding portions 20 are uniformly filled in so that the crystallinity of the semiconductor layer formed on the first layer can have excellent properties.

After layering the active layer of a multi quantum well, Mg doped AlGaN of 200 Å, undoped GaN of 1000 Å and Mg doped GaN of 200 Å are layered as a p-type semiconductor layer. The undoped GaN layer formed as a p-type semiconductor layer shows p-type characteristics due to diffusion of Mg from the neighboring layers.

Next, starting from the Mg doped GaN, the p-type semiconductor layer, the active layer and a portion of the n-type semiconductor layer are etched in order to form an n electrode so that the Si doped GaN layer is exposed.

Next, a light transmitting p-side electrode made of Ni/Au is formed on the entirety of the surface of the p-type semiconductor layer and in addition, a p pad electrode made of Au is formed at a position opposite to the exposed surface of the n-type semiconductor layer and an n electrode made of W/Al/W and an n pad electrode made of Pt/Au are formed on the exposed surface of the n-type semiconductor layer on the light transmitting p electrode.

Finally, the wafer is cut into chips of quadrangular form and mounted on a lead frame with reflectors to gain a 350 μm☐ semiconductor light emitting devices. This chip is mounted on a lead frame with a reflecting mirror to form a bullet-like LED.

The LED gained in such a manner have a light emission output to the outside of 9.8 mW according to a lamp measurement for a forward direction current of 20 mA (wavelength=400 nm).

Comparison Example 1

As a comparison example, a light emitting device is formed in the same manner as in first embodiment without the provision of unevenness on the surface of the sapphire substrate and then, the light emission output to the outside is 84 mW according to a lamp measurement for a forward direction current of 20 mA.

Example 2

A sapphire substrate, of which a C plane (0001) is used as the main surface, having the orientation flat in an A plane (11-20) is used as the substrate.

A process in the substrate and layering of an n-type semiconductor layer to a p-type semiconductor layer are carried out in the same manner as in first example.

Next, a p-type semiconductor layer made of Mg doped GaN, an active layer and a portion of the n-type semiconductor layer are etched in order to form an n electrode so that the n-type semiconductor layer made of Si doped GaN is exposed.

Figure 16:
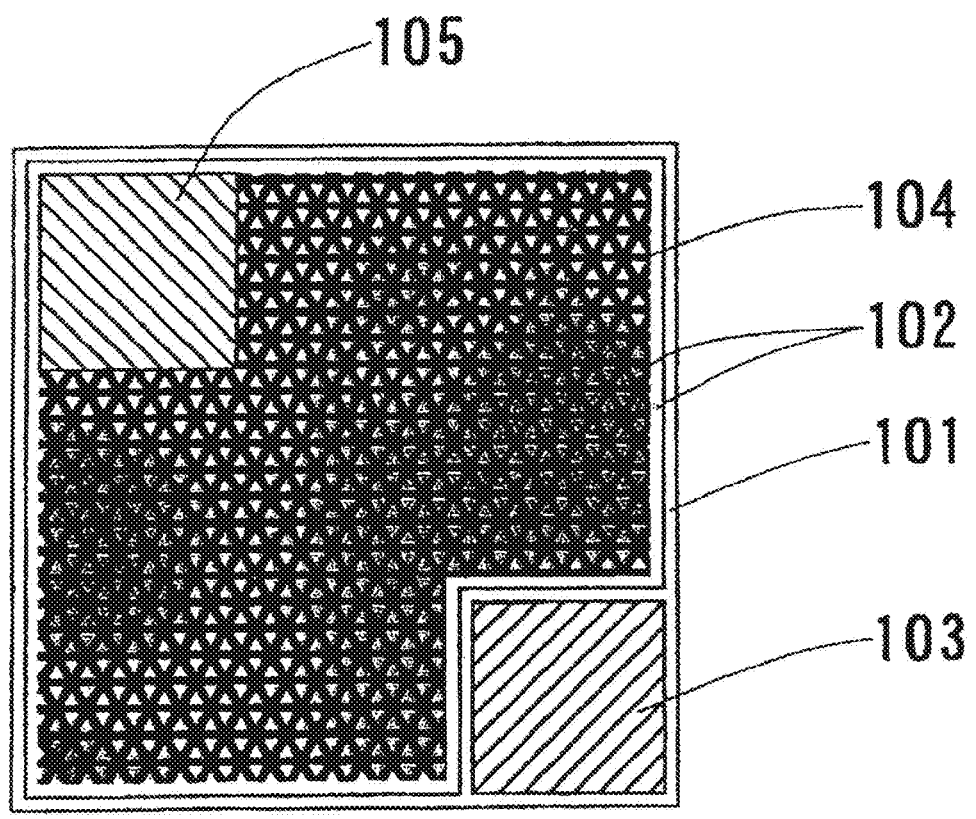
FIG. 16 is a view of a semiconductor light emitting device, viewed from above, according to another embodiment of the present invention.

Next, a photomask having a pattern wherein equilateral triangles having a side of 5 μm, as shown in FIG. 16, are most densely filled per unit area is utilized so that a light transmitting p electrode made of Ni/Au is formed on almost the entirety of the surface of the p-type semiconductor layer.

Furthermore, a p-side pad electrode made of Au is formed at a position opposite to the exposed surface of the n-type semiconductor layer on the light transmitting p electrode and an n electrode made of Ti/Al and an n pad electrode made of Pt/Au are formed on the exposed surface of the n-type semiconductor layer.

Finally, the wafer is split into chips of quadrangular forms to gain semiconductor light emitting devices. This chip is mounted on a lead frame with a reflecting mirror to form a bullet-Like LED.

The LED gained in such a manner has properties wherein the vicinity of the periphery of the p electrode emits light that is more intense than that from other portions and therefore, the light emission output is increased in comparison with first embodiment.

Example 3

A sapphire substrate, of which a C plane (0001) is used as the main surface, having the orientation flat in an A plane (11-20) is used as the substrate.

A process of the substrate and layering of an n-type semiconductor layer to a p-type semiconductor layer are carried out in the same manner as in first example.

Next, starting from Mg doped GaN, the p-type semiconductor layer, an active layer and a portion of the n-type semiconductor layer are etched, in order to form an n electrode so that the Si doped GaN layer is exposed.

Next, a photomask of a square pattern is utilized so as to form a p electrode 104 made of Rh on almost the entirety of the surface of the p-type semiconductor layer. The shape of the openings is square, of which side is 7.7 µm. The interval of the openings is 6.3 µm. The aperture ratio of the opening is about 30%.

Furthermore, a p-side pad electrode made of Pt/Au is formed at a position opposite to the exposed surface of the n-type semiconductor layer on p electrode and an n electrode made of W/Al/W and an n pad electrode made of Pt/Au are formed on the exposed surface of the n-type semiconductor layer.

Finally, the wafer is split into chips to gain semiconductor light emitting devices. This chip is mounted on a lead frame with a reflecting mirror to form a bullet-like LED.

The LED gained in such a manner has properties wherein the vicinity of the periphery of the p electrode emits light that is more intense than that from other portions and in addition, a material having a high reflectance of the wavelength of the emitted light is used for the electrode so as to reduce the light component absorbed by the electrode, and therefore, the light emission output is increased in comparison with first and second embodiments. The light emission output is 13.2 mW according to a lamp measurement.

Example 4

In the light emitting device of third example, p electrode is formed in a stripe form, as shown in FIG. 14C. By adopting such a stripe electrode structure, a current supplied from a p-side pad electrode to semiconductor layer is made uniform within the surface to increase the efficiency of the light emission.

The stripes of the first electrode are created as openings that expose semiconductor layer and therefore, the length of the edge of the electrode can be significantly increased and as a result, the efficiency of the light emission is increased. At this time, it is preferable to achieve L/S≥0.024 µm/µm² wherein the value of S is gained by adding the total area Sa of openings 5 corresponding to the plurality of stripes, which exposes semiconductor layer, and area Sb of the electrode portion that does not expose semiconductor layer, and the value of L is the total sum of the length of the circumferences of openings 5.

Example 5

A sapphire substrate, of which a C plane (0001) is used as the main surface, having the orientation flat in an A plane (11-20) is used as the substrate.

A process of the substrate and layering of an n-type semiconductor layer to a p-type semiconductor layer are carried out in the same manner as in first embodiment.

Next, the p-type semiconductor layer is etched until the Si doped GaN layer is exposed from the inside of the p-type semiconductor layer, in particular, from the center portion of the p-type semiconductor layer. The surface exposed as a result of etching at this time is formed so that portions thereof are extended toward the three vertexes forming the shape of the semiconductor light emitting device, as shown in FIG. 17.

Next, a photomask of a pattern wherein equilateral triangles having one side of 5 µm are most densely filled per unit area is utilized to form a p electrode 104 made of Rh in an equilateral triangular form on almost the entirety of the surface of the p-type semiconductor layer.

Furthermore, a p pad electrode, which is also a p diffusion electrode, 106 is formed of Pt/Au on p electrode 104. This p pad electrode, which is also a p diffusion electrode 106, is provided by extending the pad electrode along the shape of the semiconductor light emitting device that becomes an equilateral triangle, as shown in FIG. 17. By providing this electrode, it becomes easy for a current to uniformly flow through the entirety of the surface of the semiconductor layer and therefore, this electrode functions as a diffusion electrode.

In addition, an n electrode made of W/Al/W and an n pad electrode 103 made of Pt/Au are formed on the exposed surface of the n-type semiconductor layer.

Finally, the wafer is split into chips of equilateral triangular forms to gain semiconductor light emitting devices. Such a light emitting device is shown in FIG. 17, as viewed from above.

A light emitting device gained in such a manner has properties wherein the vicinity of the periphery of the p electrode emits light that is more intense than that from other portions and in addition, wherein a material having a high reflectance of the wavelength of the emitted light is used for the electrode to reduce the light component absorbed by the electrode, and furthermore, wherein the light emitting region of a multi quantum well structure is provided throughout the outer sides of the semiconductor light emitting device and therefore, the light emission output is increased in comparison with first to third embodiments.

Example 6

A light transmitting resin containing $Y_3Al_5O_{12}Y:Ce$ (YAG:Ce) having a yttrium aluminum oxide-based fluorescent substance as a base of fluorescent material is formed on the top surface and on the sides of a semiconductor light emitting device gained in fifth example.

A semiconductor light emitting device gained in such a manner emits white light having a high light emission output.

Example 7

A sapphire substrate, of which a C plane (0001) is used as the main surface, having the orientation flat in an A plane (11-20), is used as the substrate.

Figure 11L:
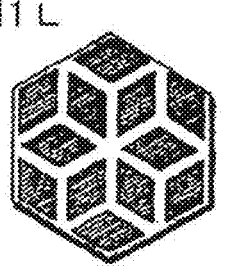
Figure 11C:
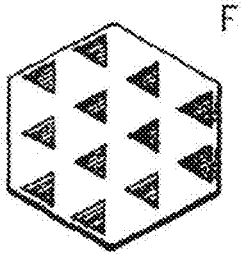
Figure 11H:
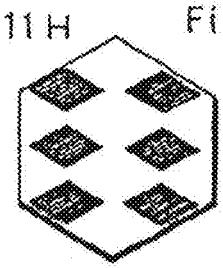
Figure 11M:
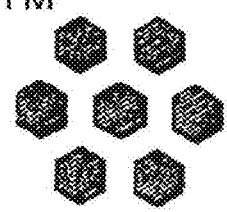
Figure 11D:
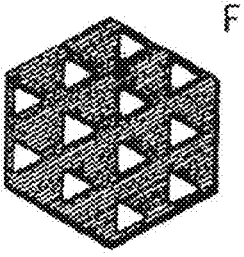
Figure 11I:
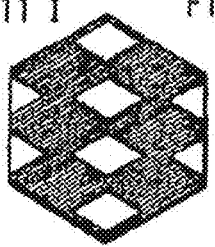
Figure 11N:
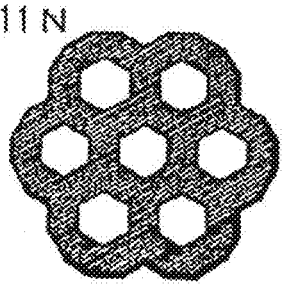
Figure 11E:
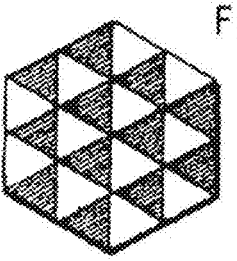
Figure 11J:
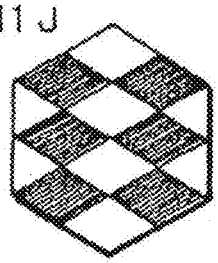

Next, following four types of protruding portions are made on the surface of the substrate. The recess and protrusions are formed in the same manner as Example 1.
(i) An equilateral-triangle like protrusions as shown in FIG. 11B are formed on the sapphire substrate. Each triangle is arranged so that one side thereof is perpendicular to the orientation flat surface of the sapphire substrate. The triangles are arranged so that the vertex thereof heads inverse direction to the adjacent triangle. The length of a side of the triangle is 5 µm and an interval between protruding portions is 2 µm.
(ii) A diamond like protrusions as shown in FIG. 11L is formed on the surface of the substrate. The side length is 4 µm, and. the interval between protruding portions is 2 µm.
(iii) A hexagon like protrusion as shown in FIG. 11M is formed on the surface of the substrate. The side length is 3 µm, and the interval between protruding portions is 2 µm.
(iv) No protrusions are formed on the substrate surface.

Next, a buffer layer, which is made to grow at a low temperature, of $AL_xGa_{1-x}N$ (0≤x≤1), of 100 Å, is layered as an n-type semiconductor layer on sapphire substrate 10 wherein the repeating pattern of protruding portions 20 is formed and undoped GaN of 3 µm, Si doped GaN of 4 µm and undoped GaN of 3000 Å are layered and then, six well layers and seven barrier layers, having respective film thickness of 60 Å and 250 Å, wherein well layers are undoped InGaN and barrier layers are Si doped GaN, are alternately layered as an active layer of a multi quantum well that becomes the light emitting region. In this case, the barrier layer that is finally layered may be of undoped GaN.

After layering the active layer of a multi quantum well, Mg doped AlGaN of 200 Å, and Mg doped GaN of 200 Å are layered as a p-type semiconductor layer.

Next, starting from the Mg doped GaN, the p-type semiconductor layer, the active layer and a portion of the n-type semiconductor layer are etched in order to form an n electrode so that the Si doped GaN layer is exposed.

Next, a light transmitting p electrode made of Ni/Au having thickness of 60 Å/70 Å is formed on the entirety of the surface of the p-type semiconductor layer and in addition, a p pad electrode made of Pt/Au is formed at a position opposite to the exposed surface of the n-type semiconductor layer and an n electrode made of W/Al/W and an n pad electrode made of Pt/Au are formed on the exposed surface of the n-type semiconductor layer on the light transmitting p electrode.

Light emitting power of bare chips in a wafer are measured with a prober. Results are shown in Table 1. In Table 1, the relative power is shown wherein the output-power of case (iv) is 1.

TABLE 1

|  | relative power |
| --- | --- |
| (i) triangle | 1.48 |
| (ii) diamond | 1.43 |
| (iii) hexagon | 1.48 |
| (iv) flat | 1 |

As shown in Table 1, more than 43% improvement is achieved with an uneven substrate. The light measurement without reflection mirrors enhances the effect of the uneven substrate.

Finally, the wafer is cut into chips of 350 μm□ quadrangular form and mounted on a lead. frame with reflectors to gain a bullet-like LED. The Vf and power (wavelength 460 nm) at 20 mA of the devices are as follows:

TABLE 2

|  | V f (V) | Power (mW) | Relative power |
| --- | --- | --- | --- |
| (i) triangle | 3.54 | 10.08 | 1.14 |
| (ii) diamond | 3.55 | 10.01 | 1.13 |
| (iii) hexagon | 3.51 | 10.30 | 1.16 |
| (iv) flat | 3.48 | 8.85 | 1 |

As shown in Table 2, more than 13% improvement is achieved with an uneven substrate. The best result is achieved with hexagon protruding portions.

Example 8

In this example, Rh electrode with openings is used alternatively. Other constructions except p-electrode are the same as those in Example 7. The shape of the openings is square, of which side is 7.7 μm. The interval of the openings is 6.3 μm. The aperture ratio of the opening is about 30%.

The results with bare chips are shown in Table 3. In Table 3, the relative power is shown wherein the output-power of case (iv) is 1.

TABLE 3

|  | relative power |
| --- | --- |
| (i) triangle | 1.54 |
| (ii) diamond | 1.56 |
| (iii) hexagon | 1.65 |
| (iv) flat | 1 |

As shown in Table 3, more than 54% improvement is achieved with an uneven substrate.

The bullet-like LEDs, which emit 460 nm light, are formed to evaluate their Vf and output power at 20 mA. The results are shown in Table 4.

TABLE 4

|  | V f (V) | Power (mW) | Relative power |
| --- | --- | --- | --- |
| (i) triangle | 3.87 | 12.74 | 1.17 |
| (ii) diamond | 3.96 | 12.95 | 1.19 |
| (iii) hexagon | 4.08 | 13.06 | 1.20 |
| (iv) flat | 3.97 | 10.85 | 1 |

As shown in Table 4, more than 17% improvement is achieved with an uneven substrate. Especially, the best results are obtained with the hexagonal protrusions.

As can be seen from Examples 7 and 8, a p-side electrode with openings can cooperate with the unevenness of the substrate, and thereby the effect of the unevenness is considerably improved.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A semiconductor light emitting diode comprising:
a substrate;
a stack of GaN based semiconductor layers disposed on or above the substrate, the semiconductor layers and the substrate being made of different materials, the stack of GaN based semiconductor layers comprising an n-type GaN based semiconductor layer, a light emitting layer disposed on or above the n-type GaN based semiconductor layer, and a p-type GaN based semiconductor layer disposed on or above the light emitting layer;
an ohmic electrode disposed on or above the p-type GaN based semiconductor layer; and
an n electrode disposed on or above the n-type GaN based semiconductor layer,
wherein the diode is configured such that light generated in the GaN based semiconductor layers is released through the ohmic electrode or the substrate,
in plan view of the stack of GaN based semiconductor layers, the n electrode is disposed at a portion of the n-type GaN based semiconductor layer exposed through other layers of the stack of GaN based semiconductor layers and, and in the plan view of the stack of GaN based semiconductor layers, the n electrode is disposed inside the p-type GaN based semiconductor layer that remains on the substrate,
the substrate comprises protrusions that are disposed on a surface of the substrate and made of a same material as the substrate, the protrusions being configured to scatter or diffract the generated light and having a two-dimensional pattern of a repeating set of protrusions, and in a sectional view of the substrate, side surfaces of the protrusions incline, and an inclination angle of the side surfaces from the surface of the substrate is more than 120 degrees and not more than 150 degrees.

2. The semiconductor light emitting diode of claim 1, wherein in the plan view of the stack of GaN based semiconductor layers, the protrusions do not have a component line that is parallel to an A-axis of the stack of GaN based semiconductor layers.

3. The semiconductor light emitting diode of claim 1, wherein the ohmic electrode covers almost the entirety of the stack of GaN based semiconductor layers.

4. The semiconductor light emitting diode of claim 1, wherein the ohmic electrode is transparent.

5. The semiconductor light emitting diode of claim 1, wherein the ohmic electrode is an alloy or a multilayer film including at least one selected from the group consisting of Ni, Pd, Co, Fe, Ti, Cu, Rh, Au, Ru, W, Zr, Mo, Ta, Pt, Ag, oxides of these metals and nitrides of these metals.

6. The semiconductor light emitting diode of claim 1, wherein the ohmic electrode is a reflecting electrode.

7. The semiconductor light emitting diode of claim 1, wherein the ohmic electrode is an alloy or a multilayer film including at least one selected from the group consisting of Rh, Ir, Ag and Al, oxides of these metals and nitrides of these metals.

8. The semiconductor light emitting diode of claim 1, wherein the substrate is a sharpie substrate having a C face as the primary surface.

9. The semiconductor light emitting diode of claim 1, further comprising a resin layer formed on or above the stack of GaN based semiconductor layers and containing yttrium aluminum oxide-based fluorescent substance.

10. A semiconductor light emitting diode comprising:
a substrate;
a stack of GaN based semiconductor layers disposed on or above the substrate, the semiconductor layers and the substrate being made of different materials, the stack of GaN based semiconductor layers comprising an n-type GaN based semiconductor layer, a light emitting layer disposed on or above the n-type GaN based semiconductor layer, and a p-type GaN based semiconductor layer disposed on or above the light emitting layer;
an ohmic electrode disposed on or above the p-type GaN based semiconductor layer; and
an n electrode disposed on or above the n-type GaN based semiconductor layer, wherein the diode is configured such that light generated in the GaN based semiconductor layers is released through the ohmic electrode or the substrate, in plan view of the stack of GaN based semiconductor layers, peripheral portions of the n-type GaN based semiconductor layer, the light emitting layer and the p-type GaN based semiconductor layer have a same shape, the substrate comprises protrusions that are disposed on a surface of the substrate and made of a same material as the substrate, the protrusions being configured to scatter or diffract the generated light and having a two-dimensional pattern of a repeating set of protrusions, and in a sectional view of the substrate, side surfaces of the protrusions incline, and an inclination angle of the side surfaces from the surface of the substrate is more than 120 degrees and not more than 150 degrees.

11. The semiconductor light emitting diode of claim 10, wherein in the plan view of the stack of GaN based semiconductor layers, the protrusions do not have a component line that is parallel to an A-axis of the stack of GaN based semiconductor layers.

12. The semiconductor light emitting diode of claim 10, wherein the ohmic electrode covers almost the entirety of the stack of GaN based semiconductor layers.

13. The semiconductor light emitting diode of claim 10, wherein the ohmic electrode is transparent.

14. The semiconductor light emitting diode of claim 10, wherein the ohmic electrode is an alloy or a multilayer film including at least one selected from the group consisting of Ni, Pd, Co, Fe, Ti, Cu, Rh, Au, Ru, W, Zr, Mo, Ta, Pt, Ag, oxides of these metals and nitrides of these metals.

15. The semiconductor light emitting diode of claim 10, wherein the ohmic electrode is a reflecting electrode.

16. The semiconductor light emitting diode of claim 10, wherein the ohmic electrode is an alloy or a multilayer film including at least one selected from the group consisting of Rh, Ir, Ag and Al, oxides of these metals and nitrides of these metals.

17. The semiconductor light emitting diode of claim 10, wherein the substrate is a sharpie substrate having a C face as the primary surface.

18. The semiconductor light emitting diode of claim 10, further comprising a resin layer formed on or above the stack of GaN based semiconductor layers and containing yttrium aluminum oxide-based fluorescent substance.

* * * * *